(12) United States Patent
Su et al.

(10) Patent No.: US 11,942,550 B2
(45) Date of Patent: Mar. 26, 2024

(54) NANOSHEET SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Chien-Chang Su, Hsinchu (TW); Yan-Ting Lin, Hsinchu (TW); Chien-Wei Lee, Hsinchu (TW); Bang-Ting Yan, Hsinchu (TW); Chih Teng Hsu, Hsinchu (TW); Chih-Chiang Chang, Hsinchu (TW); Chien-I Kuo, Hsinchu (TW); Chii-Horng Li, Hsinchu (TW); Yee-Chia Yeo, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 88 days.

(21) Appl. No.: 17/184,245

(22) Filed: Feb. 24, 2021

(65) Prior Publication Data
US 2022/0271171 A1  Aug. 25, 2022

(51) Int. Cl.
| H01L 29/786 | (2006.01) |
| H01L 21/02 | (2006.01) |
| H01L 29/06 | (2006.01) |
| H01L 29/165 | (2006.01) |
| H01L 29/423 | (2006.01) |
| H01L 29/66 | (2006.01) |
| H01L 29/78 | (2006.01) |

(52) U.S. Cl.
CPC .. *H01L 29/78618* (2013.01); *H01L 21/02532* (2013.01); *H01L 21/02603* (2013.01); *H01L 29/0673* (2013.01); *H01L 29/165* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/7848* (2013.01); *H01L 29/78696* (2013.01)

(58) Field of Classification Search
CPC ....... H01L 29/78696; H01L 21/823481; H01L 29/66545; H01L 21/823412; H01L 29/775
See application file for complete search history.

(56) References Cited

U.S. PATENT DOCUMENTS

| 2017/0256609 A1* | 9/2017 | Bhuwalka | H01L 29/78696 |
| 2018/0061992 A1* | 3/2018 | Bergendahl | H01L 21/76895 |
| 2019/0035940 A1* | 1/2019 | Hashemi | H01L 21/02433 |
| 2019/0326288 A1* | 10/2019 | Hashemi | H01L 29/42392 |
| 2019/0371898 A1* | 12/2019 | Huang | H01L 23/485 |
| 2019/0393315 A1* | 12/2019 | Noh | H01L 21/76834 |

(Continued)

*Primary Examiner* — Brian Turner
(74) *Attorney, Agent, or Firm* — Birch, Stewart, Kolasch & Birch, LLP

(57) ABSTRACT

A method for manufacturing a nanosheet semiconductor device includes forming a poly gate on a nanosheet stack which includes at least one first nanosheet and at least one second nanosheet alternating with the at least one first nanosheet; recessing the nanosheet stack to form a source/drain recess proximate to the poly gate; forming an inner spacer laterally covering the at least one first nanosheet; and selectively etching the at least one second nanosheet.

20 Claims, 24 Drawing Sheets

(56) References Cited

U.S. PATENT DOCUMENTS

| | | | |
|---|---|---|---|
| 2020/0052124 A1* | 2/2020 | Miao | H01L 21/823431 |
| 2021/0028297 A1* | 1/2021 | Yao | H01L 29/401 |
| 2021/0210598 A1* | 7/2021 | Cheng | H01L 29/66545 |
| 2021/0217848 A1* | 7/2021 | Kim | H01L 29/42392 |
| 2021/0288187 A1* | 9/2021 | Reznicek | H01L 29/66901 |

* cited by examiner

NANOSHEET SEMICONDUCTOR DEVICE AND METHOD FOR MANUFACTURING THE SAME

BACKGROUND

Since the size of integrated circuits is increasingly smaller, it has been desirable to increase the density of the arrangement of field-effect transistor (FET) semiconductor devices on a substrate. Nanosheet FET semiconductor devices have been developed to further enable larger effective conduction width in a small layout area on a substrate.

A nanosheet FET semiconductor device includes a plurality of nanosheets stacked over one another on a substrate. Each of the nanosheets may have a thickness in a scale ranging from, e.g., about 1 nanomter (nm) to about 100 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 is a partially enlarged view of FIG. 23.

FIG. 26 is a partially enlarged view of FIG. 25.

FIG. 33 is a partially enlarged view of FIG. 32.

FIG. 35 is a partially enlarged view of FIG. 34.

FIG. 37 is a partially enlarged view of FIG. 36.

DETAILED DESCRIPTION

Figure 1:
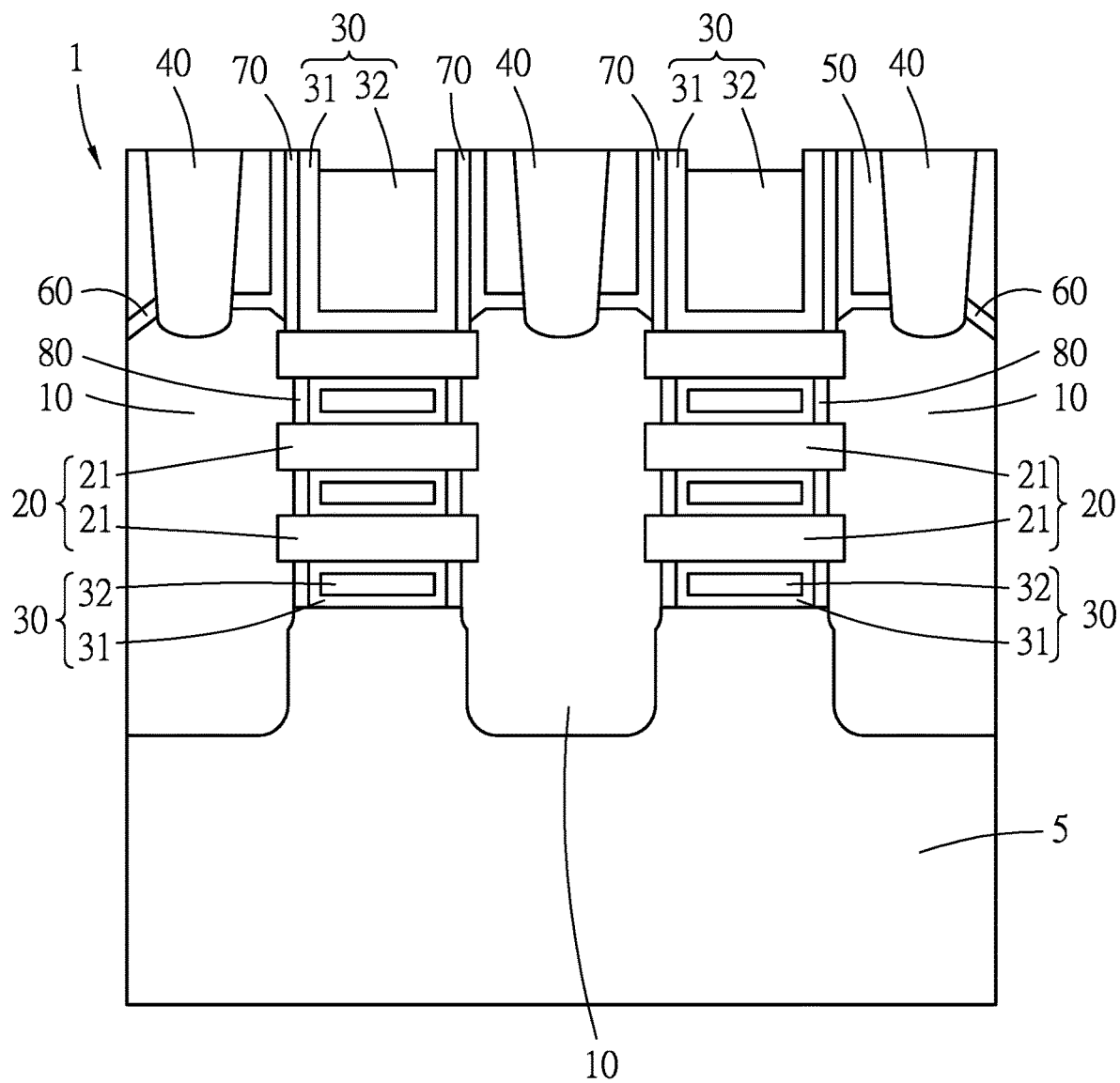
FIG. 1 illustrates a schematic view of a nanosheet semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic view of a nanosheet semiconductor device in accordance with some embodiments. A nanosheet FET semiconductor device 1 includes a plurality of source/drain regions 10, a plurality of channel regions 20, a plurality of gate structures 30, and a plurality of contact plugs 40. The source/drain regions 10 and the channel regions 20 are formed on a substrate 5 (for example but not limited to a silicon substrate). Two adjacent ones of the source/drain regions 10 are separated from each other by a corresponding one of the channel regions 20.

The source/drain regions 10 are formed by growing an epitaxial layer along nanosheets 21 (for example but not limited to silicon nanhosheets) of the channel regions 20. In addition, the source/drain regions 10 may be doped with germanium (Ge), boron (B), phosphorus (P), or arsenic (As). For example, in some embodiments, the epitaxial layer is grown along the nanosheets 21 of the channel regions 20 through an epitaxial growth process with, for example, phosphorus doping when the source/drain regions 10 to be formed are n-FET source/drain regions. In some embodiments, the epitaxial layer is grown along the nanosheets 21 of the channel regions 20 through an epitaxial growth process with, for example, geranium doping when the source/drain regions 10 to be formed are p-FET source/drain regions.

Each of the gate structures 30 includes a top gate portion disposed over a corresponding one of the channel regions 20 and a lower gate portion surrounding the nanosheets 21 of the channel regions 20. Each of the gate structure 30 includes a gate dielectric layer 31 and a metal filling layer 32 surrounded by the gate dielectric layer 31. The contact plugs 40 extend through an interlayer dielectric (ILD) layer 50 and a contact etch stop layer (CESL) 60 to contact the source/drain regions 10. The gate dielectric layer 31 of the upper gate portion of each of the gate structures 30 is separated from the ILD layer 50 by dummy spacers 70. The gate dielectric layer 31 of the lower gate portion of each of the gate structures 30 is separated from corresponding ones of the source/drain regions 10 by inner spacers 80.

Figure 2:
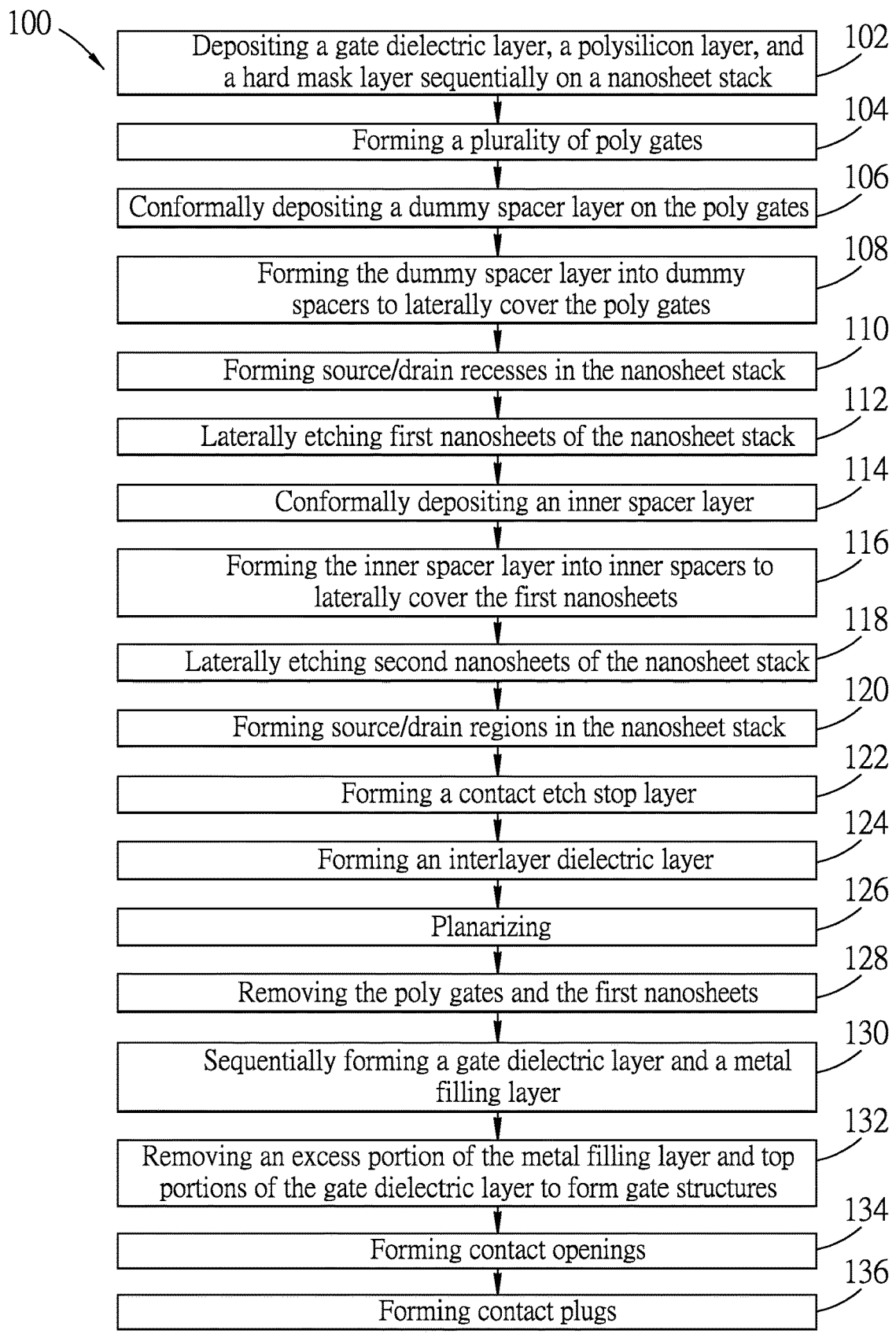
FIG. 2 is a flow diagram illustrating a method for manufacturing a nanosheet semiconductor device in accordance with some embodiments.
Figure 3:
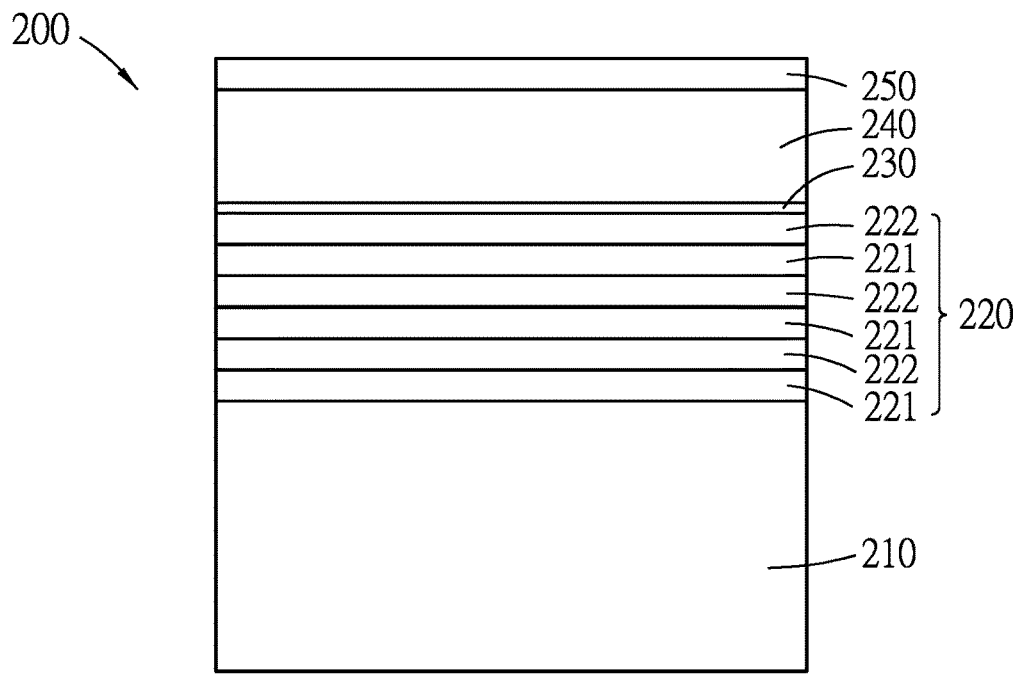
FIGS. 3 to 20 illustrate schematic views showing intermediate stages of the method for manufacturing a nanosheet semiconductor device as depicted in FIG. 2.
Figure 4:
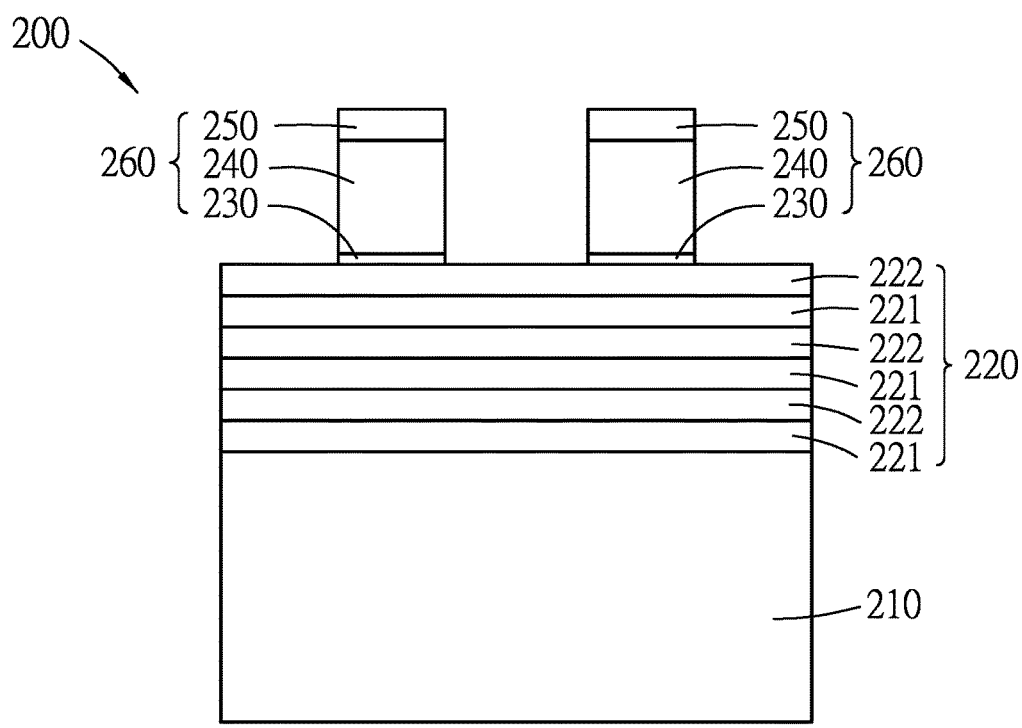
Figure 5:
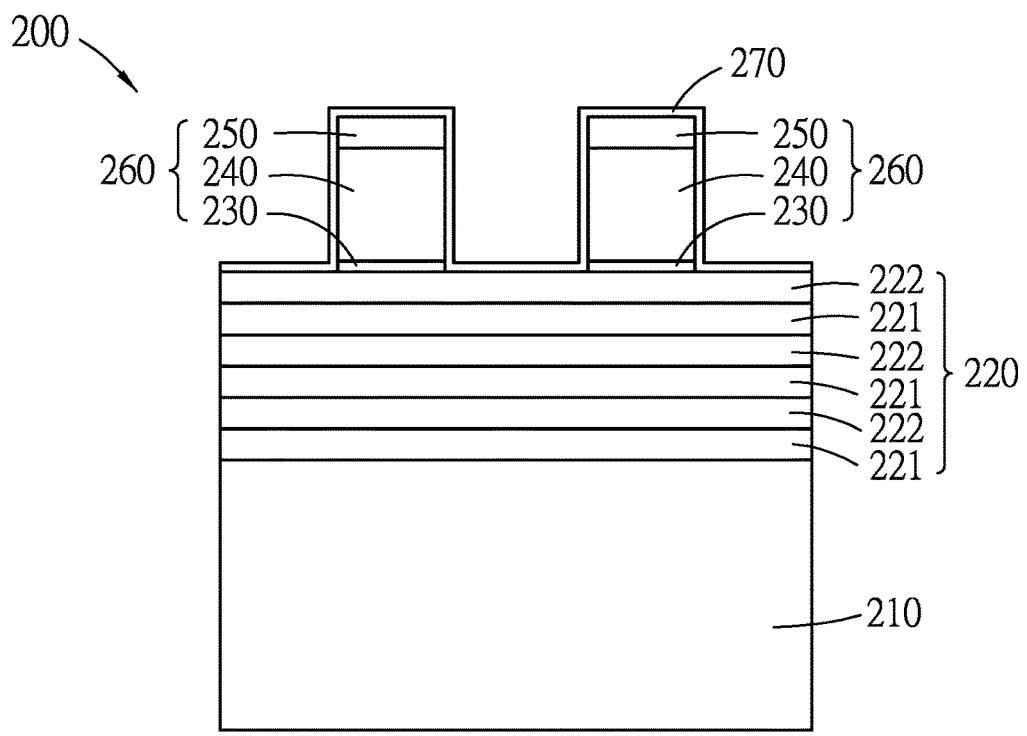
Figure 6:
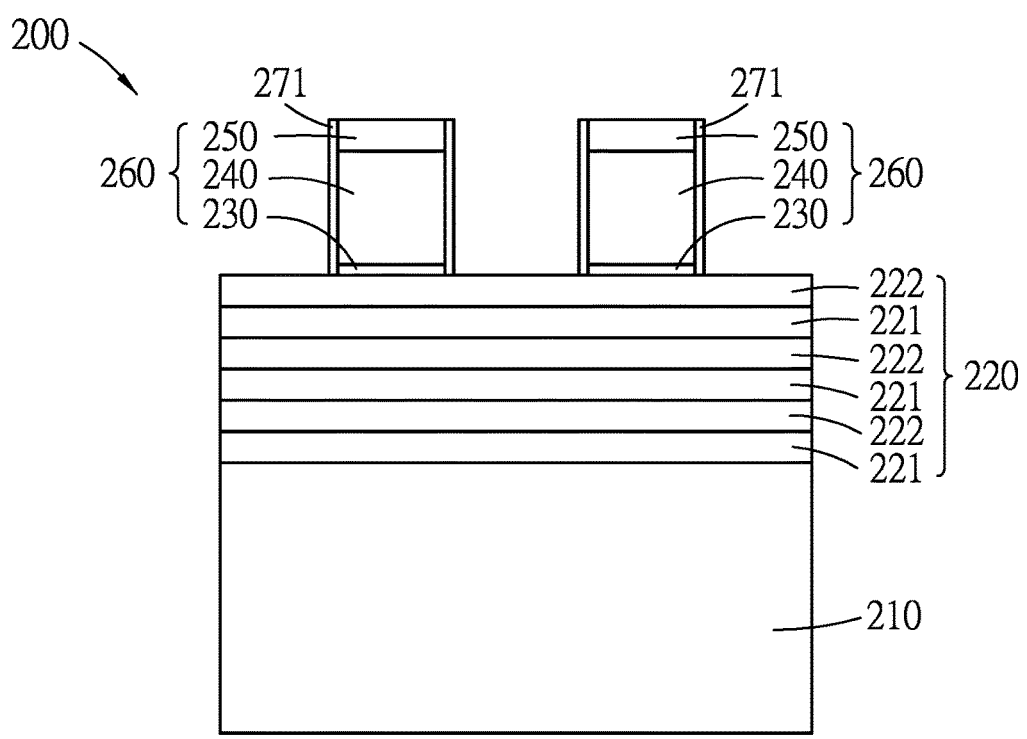
Figure 7:
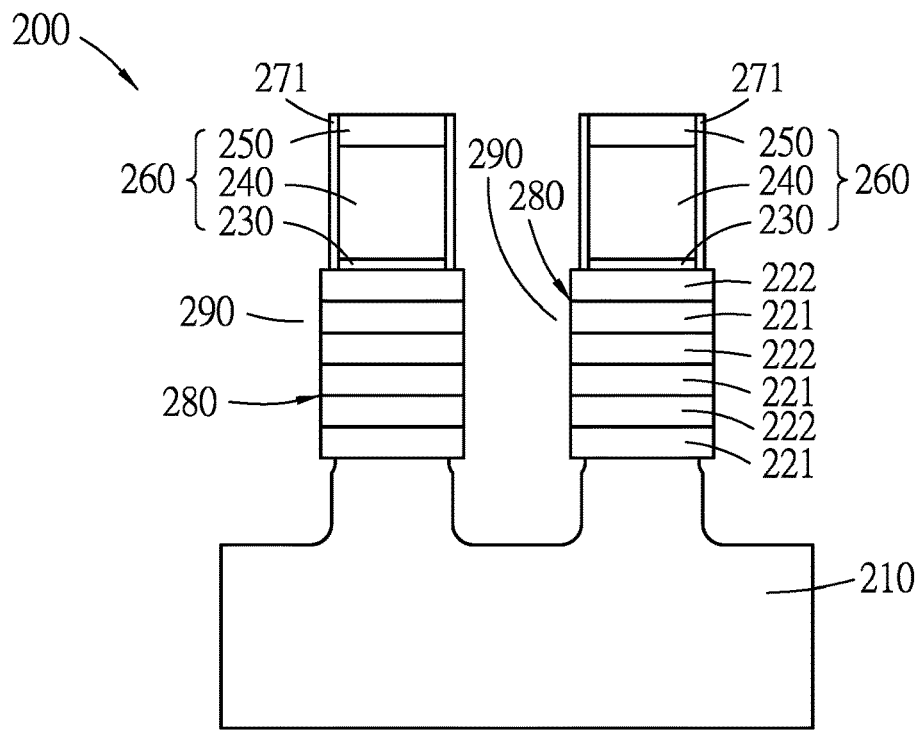
Figure 8:
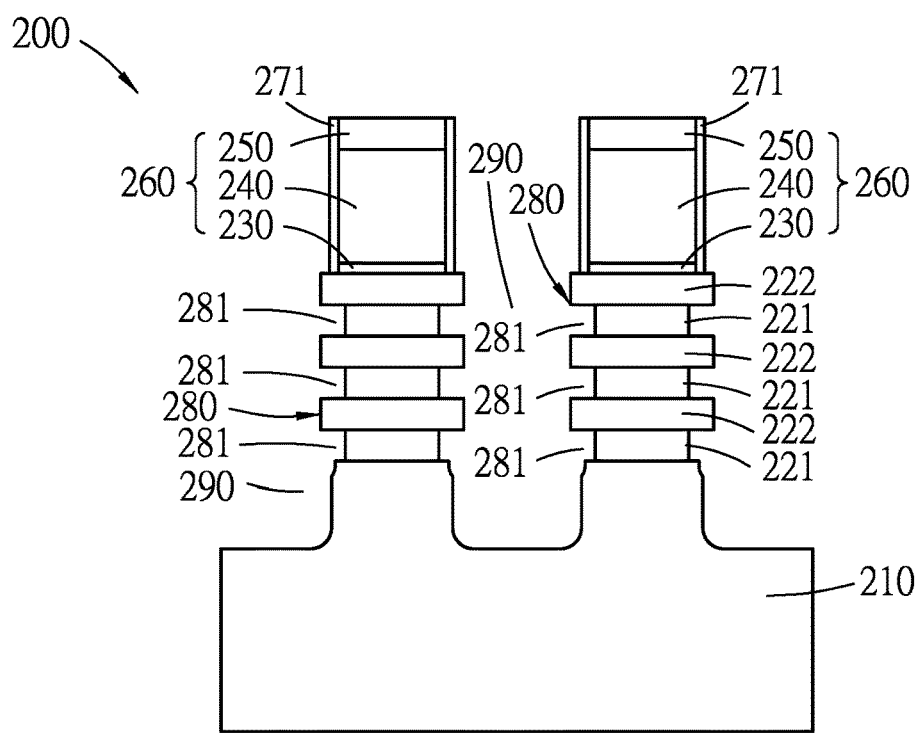
Figure 9:
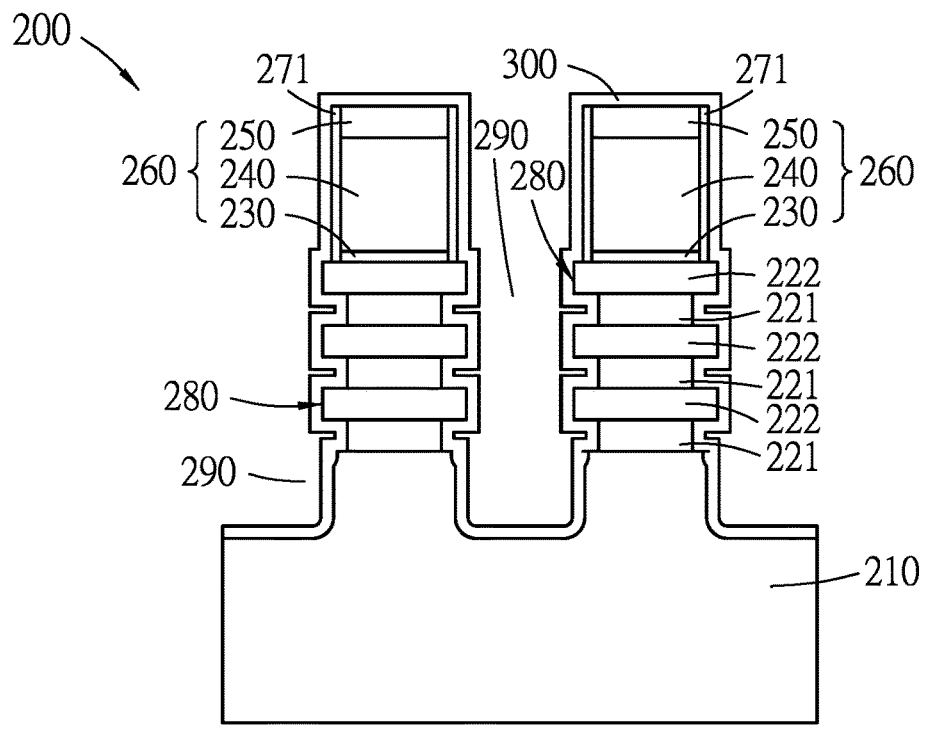
Figure 10:
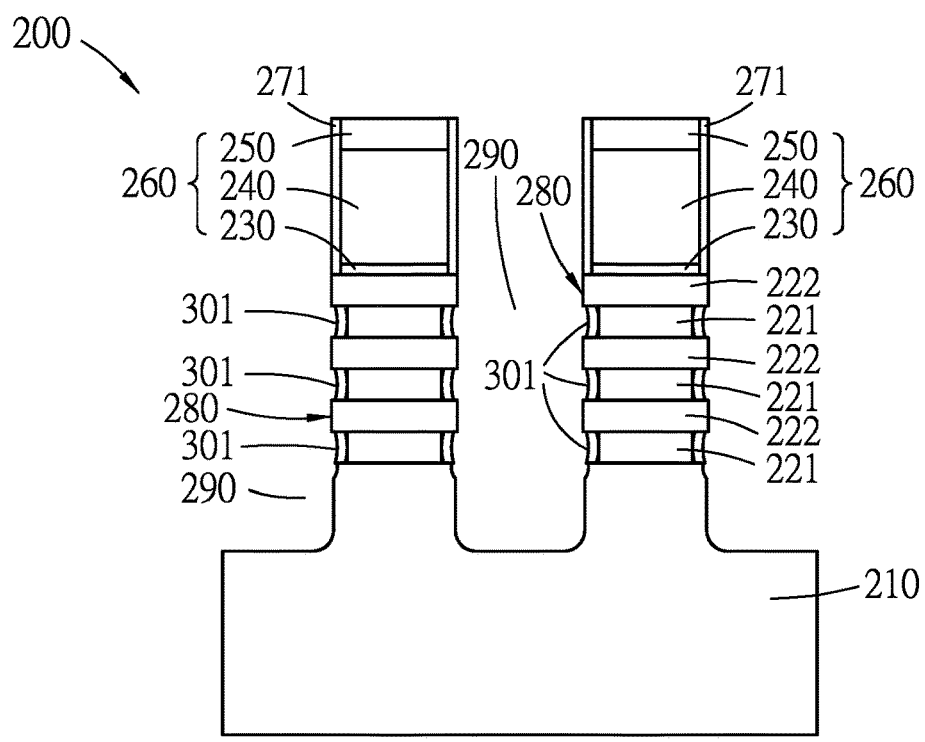
Figure 11:
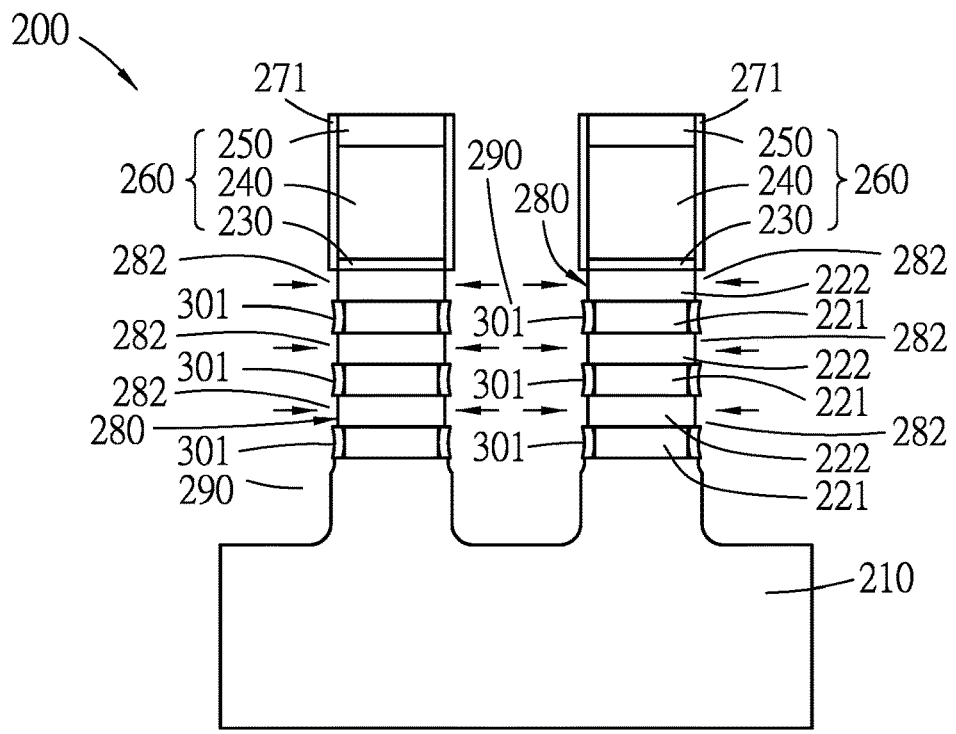
Figure 12:
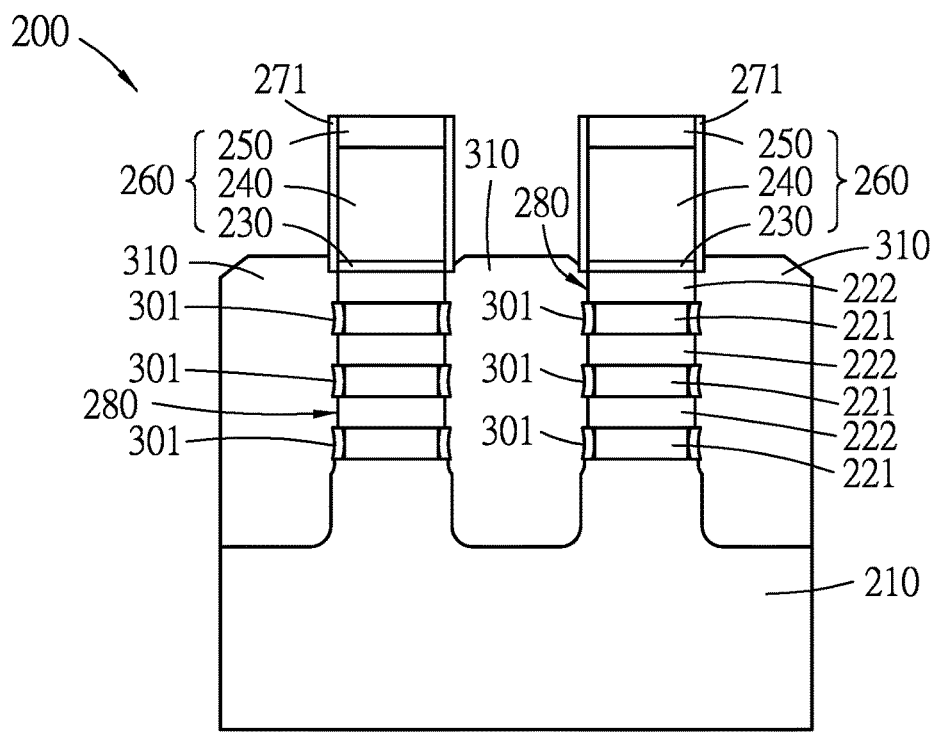
Figure 13:
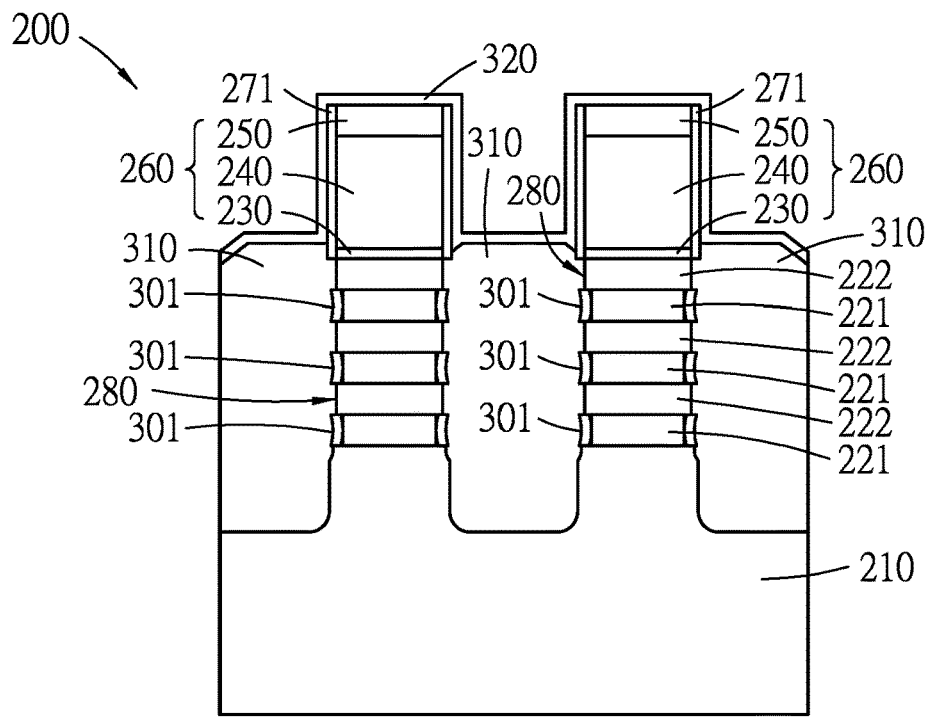
Figure 14:
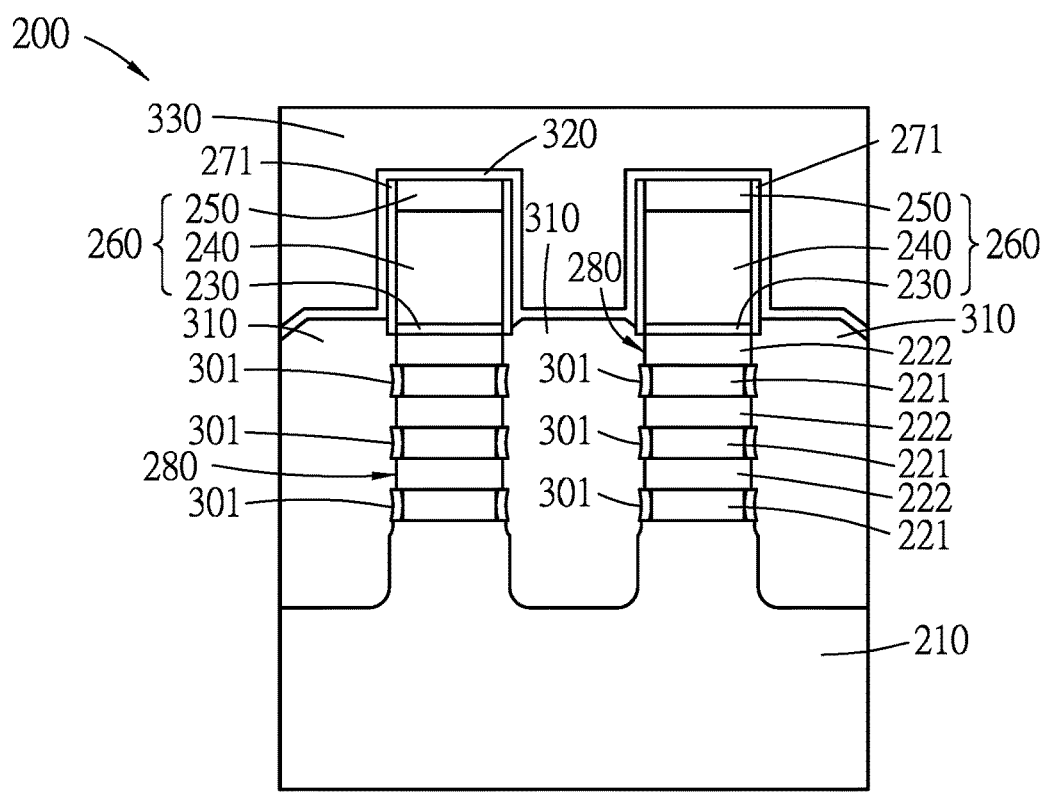
Figure 15:
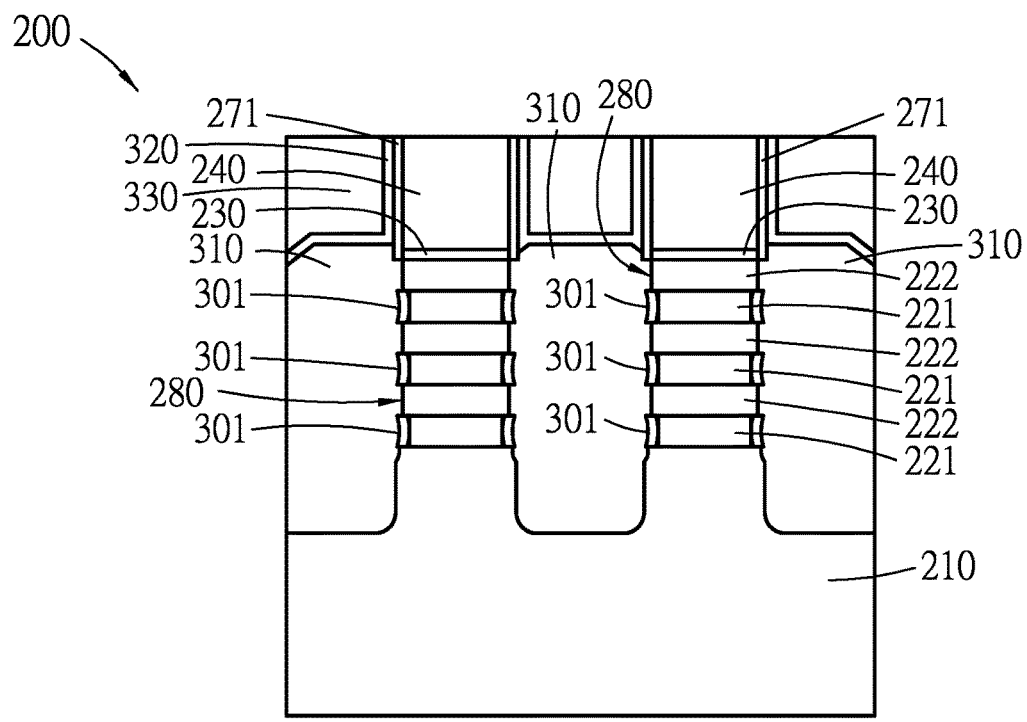
Figure 16:
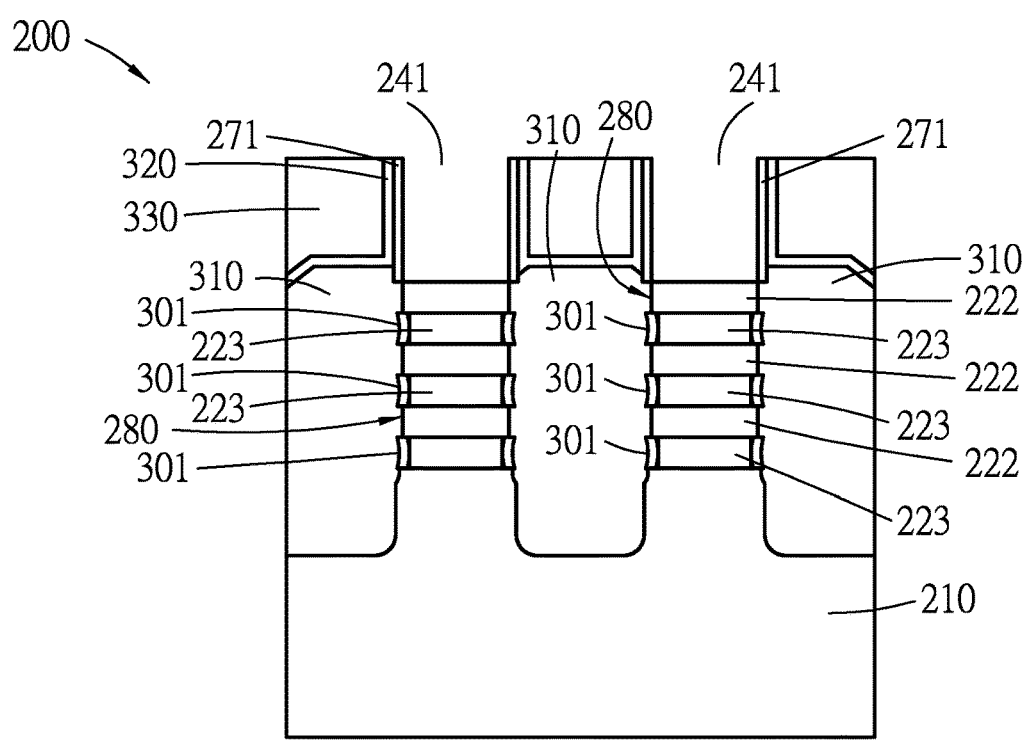
Figure 17:
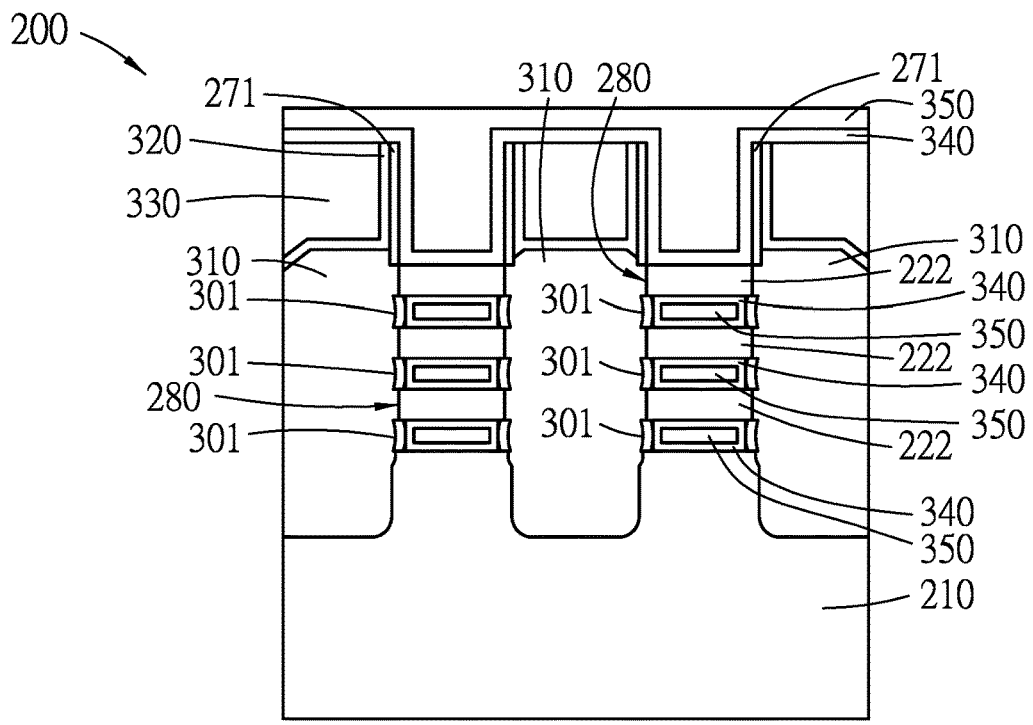
Figure 18:
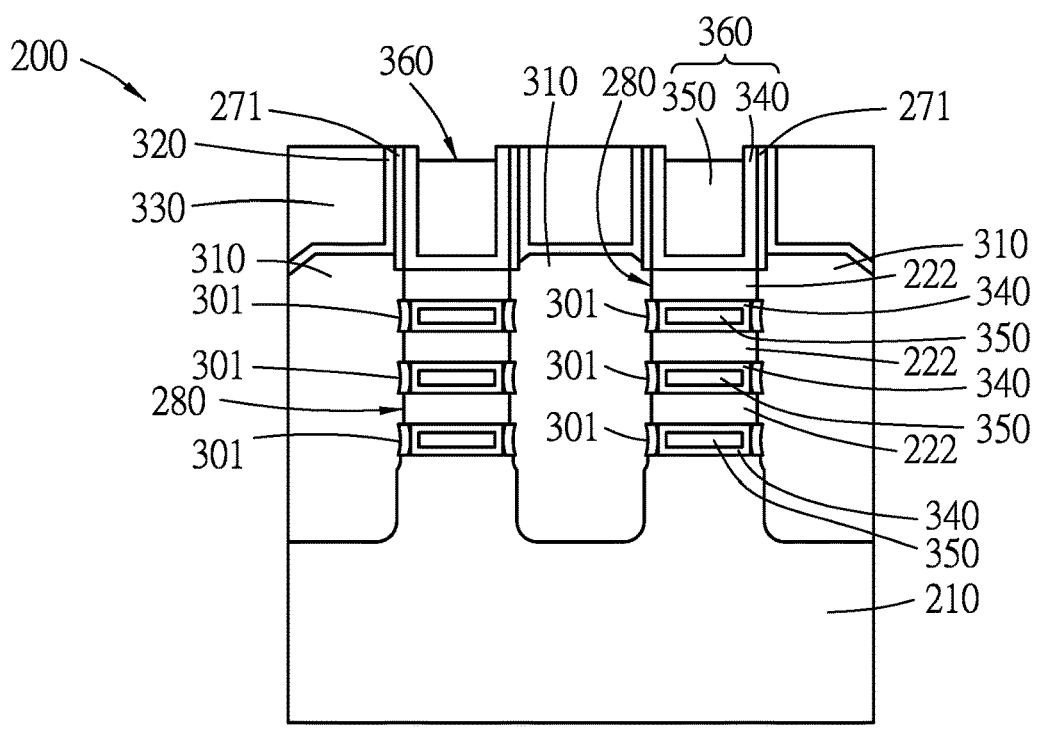
Figure 19:
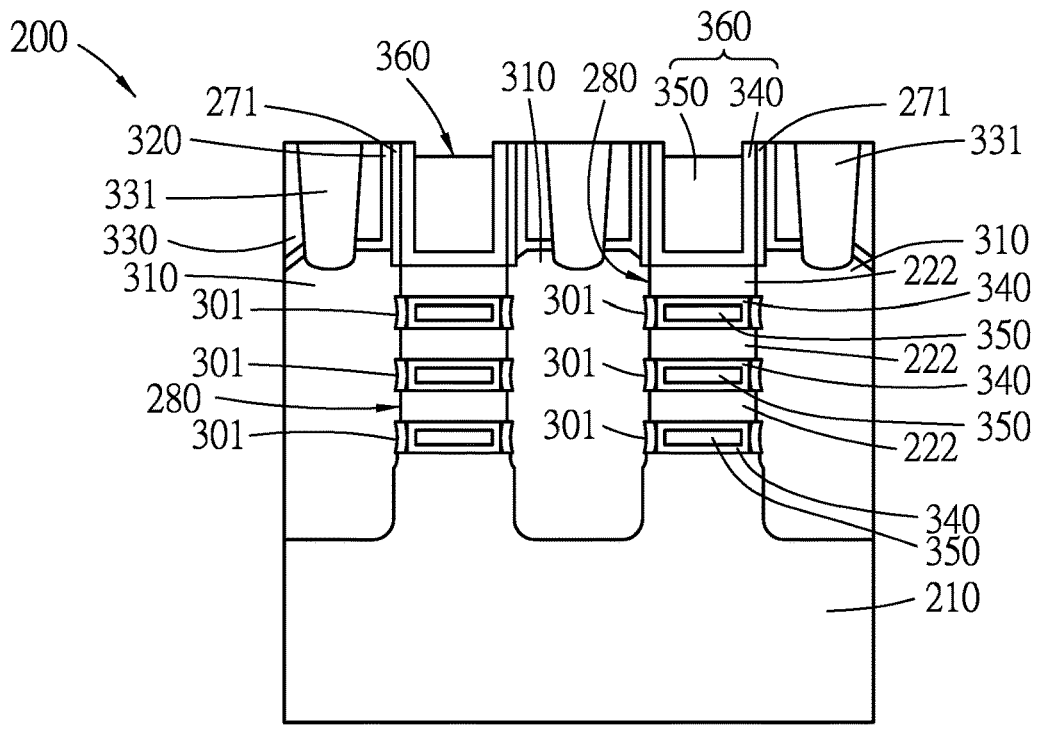
Figure 20:
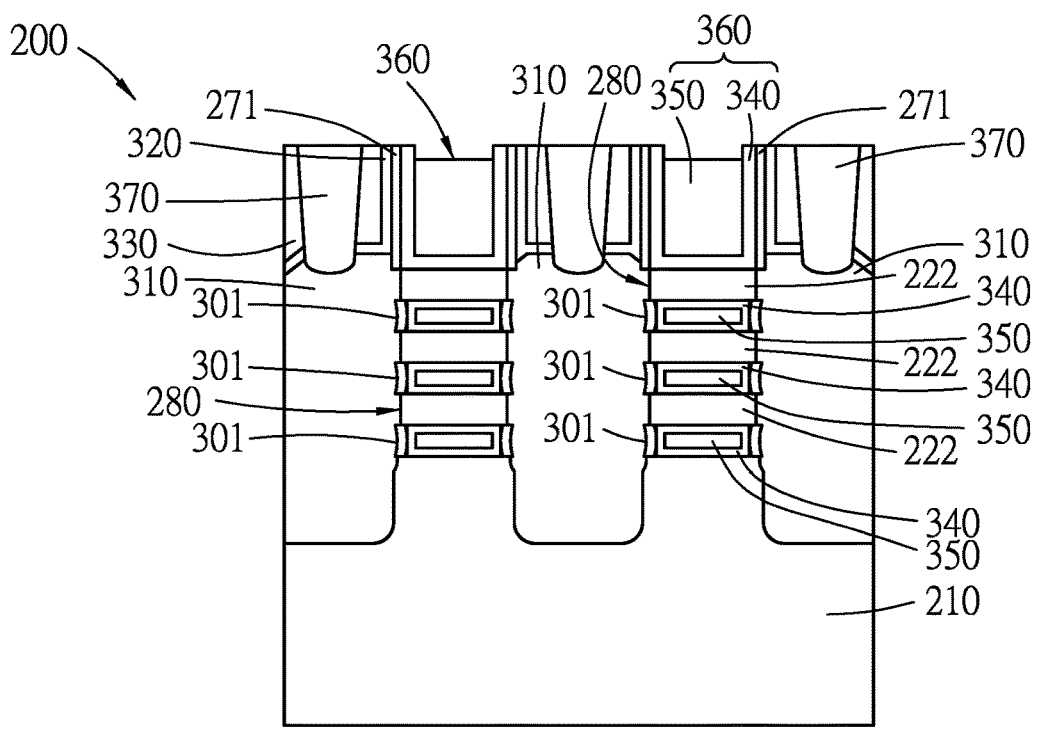

FIG. 2 illustrates a method 100 for manufacturing a nanosheet semiconductor device in accordance with some embodiments. FIGS. 3 to 20 illustrate schematic views of a nanosheet semiconductor device 200 during various stages of the method 100 of FIG. 2. The method 100 and the nanosheet semiconductor device 200 are collectively described below. However, additional steps can be provided before, after or during the method 100, and some of the steps described herein may be replaced by other steps or be eliminated. Similarly, further additional features may be present in the nanosheet semiconductor device 200, and/or features present may be replaced or eliminated in additional embodiments.

Referring to FIG. 2, the method 100 begins at block 102, where a gate dielectric layer, a polysilicon layer, and a hard mask layer are deposited sequentially on a nanosheet stack. Referring to the example illustrated in FIG. 3, a gate dielectric layer 230, a polysilicon layer 240, and a hard mask layer 250 are deposited sequentially on a nanosheet stack 220.

The nanosheet stack 220 is formed on a substrate 210, and includes a plurality of first nanosheets 221 and a plurality of second nanosheets 222, which are alternately stacked on the substrate 210. In some embodiments, the substrate 210 may include, for example but not limited to, silicon (Si). The first nanosheet 221 may include, for example but not limited to, silicon germanium (SiGe). The second nanosheet 222 may include, for example but not limited to, silicon (Si).

The gate dielectric layer 230 is formed to have a suitable thickness over the nanosheet stack 220 by a suitable process, which includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and combinations thereof. The gate dielectric layer 230 may be made of, for example but not limited to, silicon oxide, silicon oxynitride, silicon nitride, spin-on glass (SOG), fluorinated silica glass (FSG), carbon doped silicon oxide, BLACK DIAMOND® (Applied Materials of Santa Clara, Calif.), XEROGEL, AEROGEL, amorphous fluorinated carbon, Parlyene, BCB (bis-benzocyclobutenes), SILK® (Dow Chemical, Midland, Mich.), polyimide, other suitable dielectric materials, or combinations thereof. In addition, the gate dielectric layer 230 may includes a high-k dielectric material, such as $HfO_2$, HfSiO, HfSiON, HfTaO, HfTiO, HfZrO, other suitable high-k dielectric materials, or combinations thereof. The gate dielectric layer 230 may further include an interfacial layer, which comprises a grown silicon oxide layer (e.g., thermal oxide or chemical oxide) or silicon oxynitride (SiON).

The polysilicon layer 240 may be formed to have a suitable thickness over the gate dielectric layer 230 by a suitable process, which includes CVD, PVD, ALD, HDPCVD, MOCVD, RPCVD, PECVD, plating, other suitable methods, and combinations thereof. In some embodiments, the polysilicon layer 240 may be formed by CVD using silane ($SiH_4$) as a chemical gas to form the polysilicon layer 240. The polysilicon layer 240 may include a thickness ranging from about 400 angstrom (Å) to about 800 Å. In some embodiments, the gate dielectric layer 230 and the polysilicon layer 240 may be sacrificial layers and will be removed by a replacement step.

In some embodiments, the hard mask layer 250 may include, for example but not limited to, silicon oxide, silicon nitride, silicon oxynitride (SiON), silicon carbide (SiC), silicon oxycarbide (SiOC), spin-on glass (SOG), a low-k film, tetraethyl orthosilicate (TEOS), plasma enhanced CVD oxide, high-aspect-ratio-process (HARP) formed oxide, amorphous carbon material, tetraethylorthosilicate (TEOS), other suitable materials, or combinations thereof. The hard mask layer 250 may be formed using methods such as, for example but not limited to, CVD, PVD, ALD, spin-on coating, or the like, and may have a thickness ranging from about 300 Å to about 800 Å.

Referring to FIG. 2, the method 100 then proceeds to block 104, where a plurality of poly gates are formed. Referring to the example illustrated in FIGS. 3 and 4, the hard mask layer 250 is patterned using photolithography and photoresist developing technology as known to those skilled in the art of semiconductor fabrication.

For example, the hard mask layer 250 may be patterned by 193 nm immersion lithography or extreme ultraviolet (EUV) lithography. The pattern formed in the hard mask layer 250 is then transferred to the polysilicon layer 240 and the gate dielectric layer 230 by an etching process (for example but not limited to, wet etching, dry etching, or a combination thereof) to form a plurality of poly gates 260, each of which includes the gate dielectric layer 230 disposed on the nanosheet stack 220, the polysilicon layer 240 disposed on the gate dielectric layer 230, and the hard mask layer 250 disposed on the polysilicon layer 240.

Referring to FIG. 2, the method 100 then proceeds to block 106, where a dummy spacer layer is conformally deposited on the poly gates. Referring to the example illustrated in FIG. 5, a dummy spacer layer 270 is conformally deposited to cover the poly gates 260 and the nanosheet stack 220. The conformal deposition may be implemented by a suitable deposition process as known to those skilled in the art of semiconductor fabrication, for example but not limited to, PVD, CVD, PECVD, ALD, plasma-enhanced atomic layer deposition (PEALD), etc., or combinations thereof. Examples of a material suitable for forming the dummy spacer layer 270 include silicon oxide, silicon nitride, silicon carbide, silicon oxycarbide, silicon oxynitride, silicon carbonitride, silicon oxycarbonitride, and combinations thereof, but are not limited thereto.

Referring to FIG. 2, the method 100 then proceeds to block 108, where the dummy spacer layer is formed into a plurality of dummy spacers to laterally cover the poly gates. Referring to the example illustrated in FIGS. 5 and 6, the dummy spacer layer 270 is anisotropically etched to etch away the horizontal portions of the dummy spacer layer 270 to form a plurality of dummy spacers 271 extending upwardly from the nanosheet stack 220 and laterally covering the poly gates 260.

Referring to FIG. 2, the method 100 then proceeds to block 110, where the nanosheet stack is recesses to form a plurality of source/drain recesses. Referring to the example illustrated in FIGS. 6 and 7, the nanosheet stack 220 are recessed by an anisotropic etching process to form a plurality of source/drain recesses 290 and a plurality of channel regions 280. Adjacent two of the channel regions 280 are separated from each other by a corresponding one of the source/drain recesses 290. The anisotropic etching process may be a suitable anisotropic etching as known to those skilled in the art of semiconductor fabrication, for example but not limited to, anisotropic dry etching.

Referring to FIG. 2, the method 100 then proceeds to block 112, where the first nanosheets are laterally etched. Referring to the example illustrated in FIG. 8, the first nanosheets 221 are laterally recessed by an isotropic etching process to remove side portions of the first nanosheets 221 based on a relatively high etching selectivity of the first nanosheets 221 with respect to the second nanosheets 222, so as to form first lateral recesses 281.

Referring to FIG. 2, the method 100 then proceeds to block 114, where an inner spacer layer is conformally deposited. Referring to the example illustrated in FIG. 9, an inner spacer layer 300 is conformally deposited to cover the poly gates 260, the dummy spacers 271, the channel regions 280, and the substrate 210. As described above, the conformal deposition may be implemented by a suitable deposition process as known to those skilled in the art of semiconductor fabrication, for example but not limited to, PVD, CVD, PECVD, ALD, PEALD, etc., or combinations thereof. Examples of a material suitable for forming the inner spacer layer 300 may include silicon oxide, silicon nitride, silicon carbide, silicon oxycarbide, silicon oxynitride, silicon carbonitride, silicon oxycarbonitride, and combinations thereof, but are not limited thereto.

Referring to FIG. 2, the method 100 then proceeds to block 116, where the inner spacer layer is formed into a plurality of inner spacers to laterally cover the first nanosheets. Referring to the example illustrated in FIGS. 9 and 10, the inner spacer layer 300 is subjected to an isotropic etching process to form a plurality of inner spacers 301 in the first lateral recesses 281 to laterally cover the first nanosheets 221. The isotropic etching process may be dry isotropic etching, wet isotropic etching, or a combination thereof.

Referring to FIG. 2, the method 100 then proceeds to block 118, where the second nanosheets are laterally etched. Referring to the example illustrated in FIG. 11, the second nanosheets 222 are laterally recessed by isotropic etching to perform a proximity push process to remove side portions of the second nanosheets 222 based on a relatively high etching selectivity of the second nanosheets 222 with respect to the inner spacers 301 and the dummy spacers 271, so as to form second lateral recesses 282. The second lateral recesses 282 are spatially communicated with the source/drain recesses 290.

Referring to FIG. 2, the method 100 then proceeds to block 120, where source/drain regions are formed in the source/drain recesses. Referring to the example illustrated in FIGS. 11 and 12, source/drain regions 310 are formed by growing an epitaxial layer in the source/drain recesses 290 along the inner spacers 301 and the second nanosheets 222 through epitaxial growth. In some embodiments, the technique for the epitaxial growth may include a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process, and combinations thereof, but may not be limited thereto. In some embodiments, the technique for the epitaxial growth may include a cyclic deposition-etch (CDE) epitaxy process, a selective epitaxial growth (SEG) process, and the like, but may not be limited thereto. The source/drain regions 310 may be doped with germanium (Ge), boron (B), phosphorus (P), or arsenic (As). For example, in some embodiments, the epitaxial layer is grown in the source/drain recesses 290 along the inner spacers 301 and the second nanosheets 222 through an epitaxial growth process with, for example, phosphorus doping when the source/drain regions 310 to be formed are n-FET source/drain regions. In some embodiments, the epitaxial layer is grown in the source/drain recesses 290 along the inner spacers 301 and the second nanosheets 222 through an epitaxial growth process with, for example, geranium doping when the source/drain regions 310 to be formed are p-FET source/drain regions.

Referring to FIG. 2, the method 100 then proceeds to block 122, where a contact etch stop layer is formed. Referring to the example illustrated in FIG. 13, a contact etch stop layer (CESL) 320 is conformally deposited to cover the source/drain regions 310, the dummy spacers 271, and the poly gates 260. Examples of a material suitable for forming the CESL 320 may include silicon nitride, carbon-doped silicon nitride, and the like, but are not limited thereto. The CESL 320 may have a suitable thickness. In some embodiments, the CESL 320 may have a thickness in the range of about 180 Å to about 220 Å. In some embodiments, the CESL 320 may be deposited using, for example but not limited to, CVD, HDPCVD, sub-atmospheric CVD (SACVD), molecular layer deposition (MLD), sputtering, or other suitable methods. For example, in some embodiments, the MLD process is generally carried out under a pressure less than 10 mTorr and in a temperature ranging from about 350° C. to about 500° C. In some embodiments, the silicon nitride is deposited by reacting a silicon source compound and a nitrogen source. The silicon source compound provides silicon for the deposited silicon nitride and may be silane ($SiH_4$), tetrathoxysilane (TEOS), or the like. The nitrogen source provides nitrogen for the deposited silicon nitride and may be ammonia ($NH_3$), nitrogen gas ($N_2$), or the like. In some embodiments, the carbon-doped silicon nitride is deposited by reacting a carbon source compound, a silicon source compound, and a nitrogen source. The carbon source compound may be an organic compound, such as a hydrocarbon compound, e.g., ethylene ($C_2H_4$).

Referring to FIG. 2, the method 100 then proceeds to block 124, where an interlayer dielectric layer is formed. Referring to the example illustrated in FIG. 14, an interlayer dielectric (ILD) layer 330 is deposited over the CESL 320. Because the semiconductor device pitch is scaling down, the material of the ILD layer 330 needs to have good gap-fill capability to fill the spaces among the poly gates 260. The ILD layer 330 is made of a dielectric material. In some embodiments, examples of the the dielectric material may includes silicon oxide, silicon nitride, silicon oxynitride (SiON), phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and combinations thereof, but are not limited thereto. In some embodiments, the ILD layer 330 may be deposited over the CESL 320 to a suitable thickness by, for example but not limited to, CVD, HDPCVD, SACVD, spin-on, sputtering, or other suitable methods. In some embodiments, the ILD layer 330 may have a thickness in the range from about 3000 Å to about 4500 Å.

Referring to FIG. 2, the method 100 then proceeds to block 126, where the nanosheet semiconductor device is planarized. Referring to the example illustrated in FIGS. 14 and 15, the nanosheet semiconductor device 200 is subjected to a planarization process (for example but not limited to, chemical mechanical planarization (CMP)) to remove an excess portion of the ILD layer 330, portions of the CESL 320, portions of the dummy spacers 271, and the hard mask layer 250 until a top surface of the polysilicon layer 240 of each of the poly gates 260 is exposed.

Referring to FIG. 2, the method 100 then proceeds to block 128, where the poly gates and the first nanosheets are removed. Referring to the example illustrated in FIGS. 15 and 16, the polysilicon layer 240, the gate dielectric layer 230, and the first nanosheets 221 are removed by one or more etching processes (for example but not limited to, wet etching, dry etching, or a combination thereof) to form first voids 241 defined by the dummy spacers 271 and second voids 223 defined by the inner spacers 301 and the second nanosheets 222. In some embodiments, the polysilicon layer 240 and the gate dielectric layer 230 are first removed to form the first voids 241, and the first nanosheets 221 are then removed to form the second voids 223.

Referring to FIG. 2, the method 100 then proceeds to block 130, where a gate dielectric layer and a metal filling layer are sequentially formed. Referring to the example illustrated in FIGS. 16 and 17, a gate dielectric layer 340 and a metal filling layer 350 are sequentially formed in the first voids 241 and the second voids 223, and over the ILD layer 330, the CESL 320, and the dummy spacers 271 through a deposition process, such as, for example but not limited to, CVD, HDPCVD, SACVD, MLD, PVD, sputtering, etc. The gate dielectric layer 340 may include a sub-layer of an interlayer dielectric material and a sub-layer of a high dielectric constant (k) material. Examples of the interlayer dielectric material may include silicon oxide, silicon nitride, silicon oxynitride, and combinations thereof, but are not limited thereto. The metal filling layer 350 may include a barrier sub-layer, a work function sub-layer, and a filling material sub-layer. The barrier sub-layer may prevent diffusion of metal into the gate dielectric layer 340. Examples of a material suitable for the work function sub-layer may include titanium, aluminum, tantalum carbide, tantalum carbide nitride, tantalum silicon nitride, and combinations thereof, but are not limited thereto. Examples of a material suitable for the filling material sub-layer may include aluminum, tungsten, copper, and other conductive metals, but are not limited thereto.

Referring to FIG. 2, the method 100 then proceeds to block 132, where an excess portion of the metal filling layer and top portions the gate dielectric layer are removed. Referring to the example illustrated in FIGS. 17 and 18, an excess portions of the metal filling layer 350 and top portions of the gate dielectric layer 340 over the ILD layer 330, the CESL 320, and the dummy spacers 271 are removed trough a planarization process such as, for example but not limited to, CMP to form gate structures 360, each of which includes a top gate portion disposed over a corresponding one of the channel regions 280 and a lower gate portion surrounding the second nanosheets 222. Each of the inner spacers 301 laterally covers the lower gate portion of a corresponding one of the gate structures 360 to separate the lower gate portion of the corresponding one of the gate structures 360 from a corresponding one of the source/drain regions 310.

Referring to FIG. 2, the method 100 then proceeds to block 134, where the ILD layer and the CESL are etched to form contact openings. Referring to the example illustrated in FIG. 19, a part of the ILD layer 330 and a part of the CESL 320 are etched through a patterned photoresist (not shown) to form contact openings 331. The contact openings 331 are formed to expose the source/drain regions 310. Formation of the contact openings 331 may be implemented using a suitable etching process known in the art, for example but not limited to, a dry etching process, a wet etching process, or a combination thereof.

Referring to FIG. 2, the method 100 then proceeds to block 136, where contact plugs are formed. Referring to the example illustrated in FIGS. 19 and 20, a conductive material is filled in the contact openings 331 by a suitable deposition method known in the art, for example but not limited to, ALD or the like to form contact plugs 370, which extend through the ILD layer 330 and the CESL 320 to contact the source/drain regions 310. In some embodiments, the conductive material suitable for the contact plugs 370 may include, for example but not limited to, tungsten (W), aluminum (Al), copper (Cu), titanium nitride (TiN), tantalum nitride (TaN). other metal(s) or metal alloys, or the like.

Figure 21:
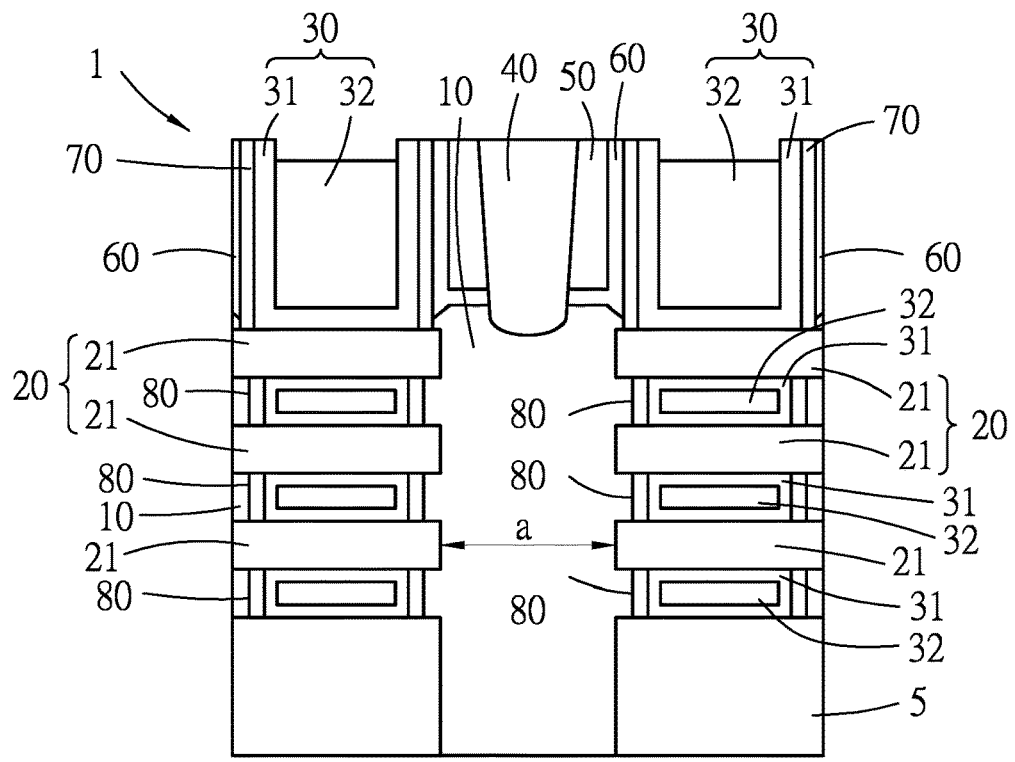
FIGS. 21 and 22 illustrate schematic views for comparing epitaxial widths between a nanosheet semiconductor device in accordance with some embodiments without implementation of a proximity push process and a nanosheet semiconductor device in accordance with some embodiments with implementation of the proximity push process.
Figure 22:
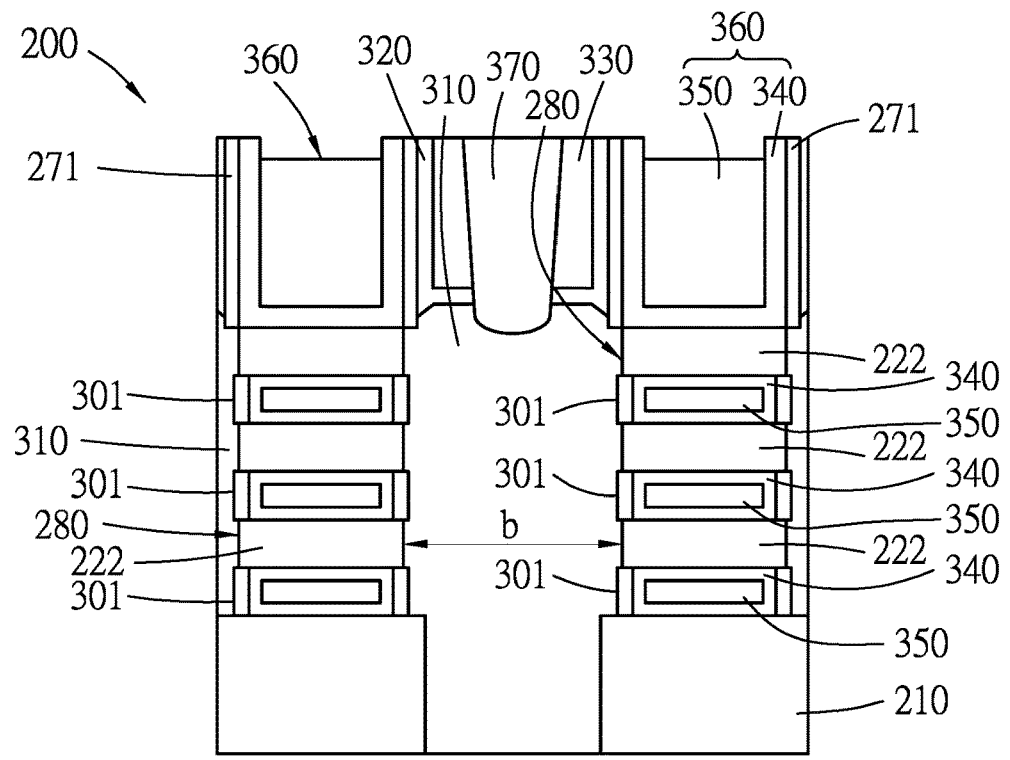

Referring to FIGS. 21 and 22, which illustrates schematic views for comparing epitaxial widths between the nanosheet semiconductor device 1 in accordance with some embodiments without implementation of the proximity push process and the nanosheet semiconductor device 200 in accordance with some embodiments with implementation of the proximity push process. As shown in FIG. 21, the nanosheet semiconductor device 1 has an epitaxial width, as shown with a reference "a" in FIG. 21. The epitaxial width (a) is defined by a distance between the nanosheets 21 at two opposite sides of a corresponding one of the source/drain regions 10. As shown in FIG. 22, the nanosheet semiconductor device 200 has an epitaxial width, as shown with a reference "b" in FIG. 22. Similarly, the epitaxial width (b) is defined by a distance between the second nanosheets 222 at two opposite sides of a corresponding one of the source/drain regions 310. It is apparent that the epitaxial width (b) in the source/drain regions 310 of the nanosheet semiconductor device 200 is greater than the epitaxial width (a) in the source/drain regions 10 of the nano sheet semiconductor device 1. It indicates that the epitaxial width (b) in the source/drain regions 310 of the nanosheet semiconductor device 200 is increased with implementation of the proximity push process. In other words, the volume of the source/drain regions 310 of the nanosheet semiconductor device 200 is increased as compared to the volume of the source/drain regions 10 of the nanosheet semiconductor device 1. Therefore, a channel strain in the channel regions 280 of the nanosheet semiconductor device 200 can be boosted accordingly, so that the carrier mobility for the nanosheet semiconductor device 200 can be enhanced.

Figure 23:
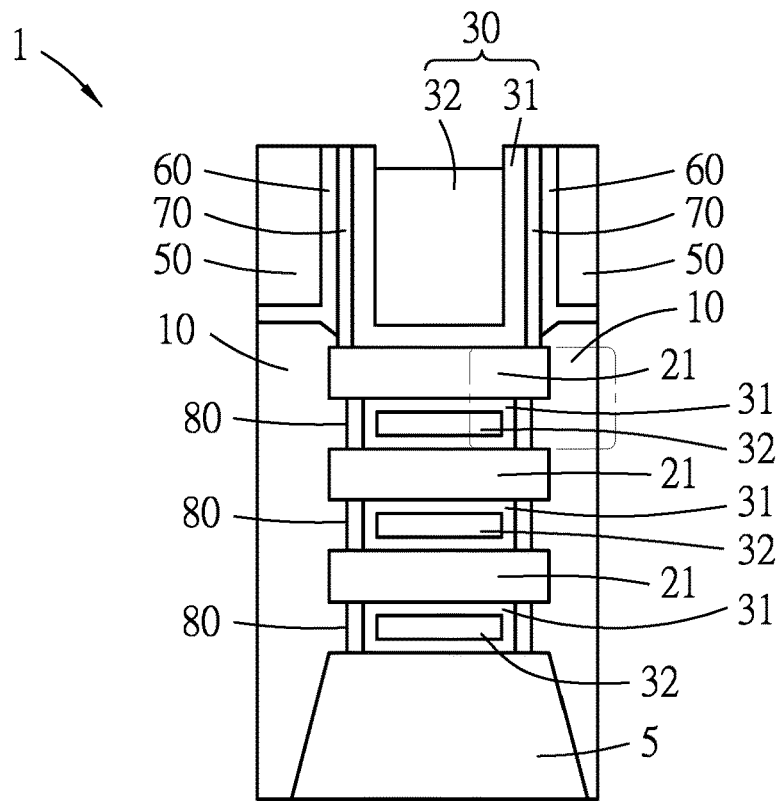
FIGS. 23 and 24 illustrate schematic views for comparing a proximity and an inner spacer lateral thickness of the nanosheet semiconductor device in accordance with some embodiments without implementation of the proximity push process.
Figure 24:
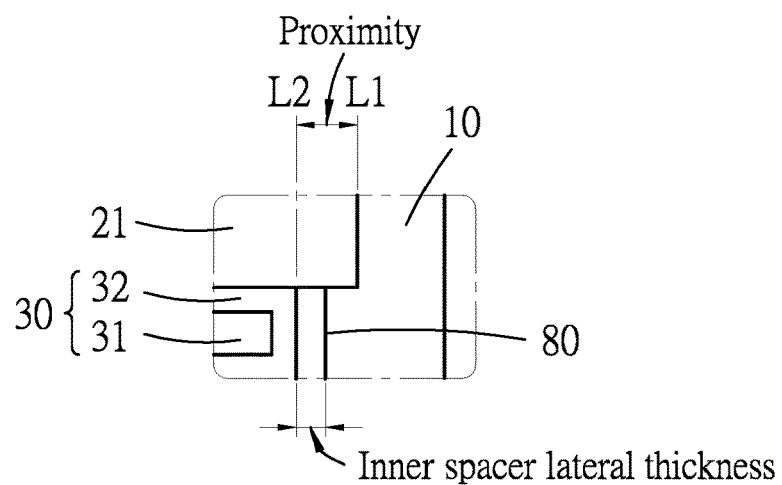

FIGS. 23 and 24, illustrate schematic views for comparing a proximity and an inner spacer lateral thickness of the nanosheet semiconductor device 1 without implementation of the proximity push process, in which the proximity is defined by a distance between a first reference line L1 and a second reference line L2. The first reference line L1 is defined by an interface between the nanosheet 21 and a corresponding one of the source/drain regions 10. The second reference line L2 is defined by an interface between the gate structure 30 and the inner spacer 80. In the nanosheet semiconductor device 1, the proximity is greater than the inner spacer lateral thickness because the proximity push process is not implemented.

Figure 25:
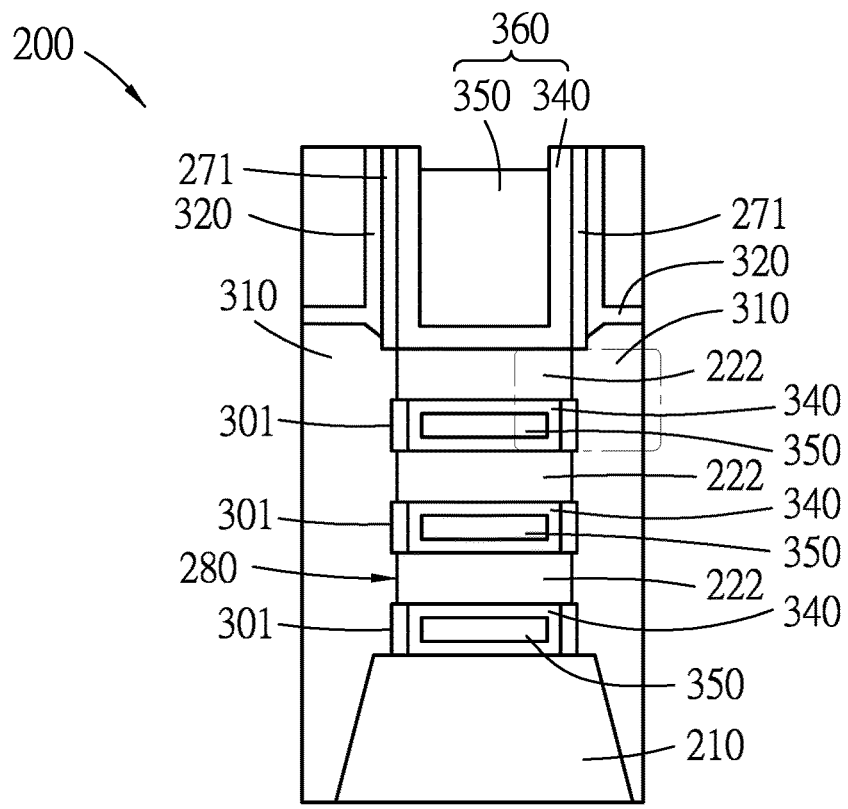
FIGS. 25 and 26 illustrate schematic views for comparing a proximity and an inner spacer lateral thickness of the nanosheet semiconductor device in accordance with some embodiments with implementation of the proximity push process.
Figure 26:
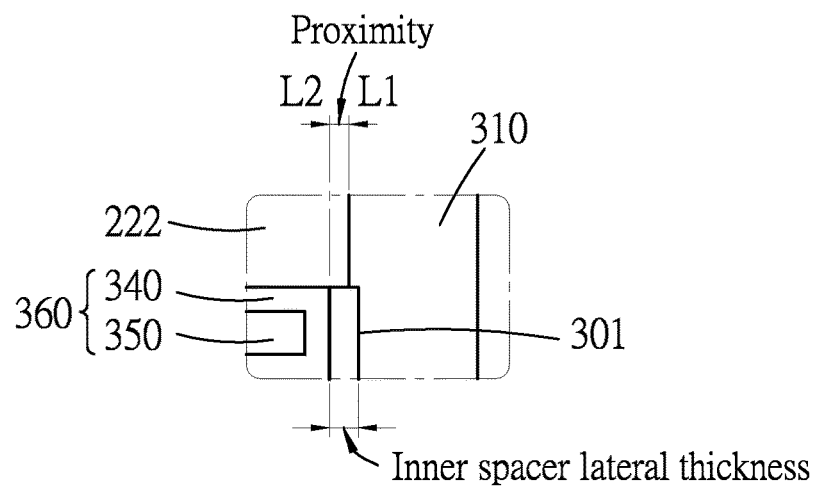

FIGS. 25 and 26 illustrate schematic views for comparing a proximity and an inner spacer lateral thickness of the nanosheet semiconductor device 200 with implementation of the proximity push process, in which the proximity is defined by a distance between a first reference line L1 and a second reference line L2. Similarly, the first reference line L1 is defined by an interface between the nanosheet 222 and a corresponding one of the source/drain regions 310. The second reference line L2 is defined by an interface between the gate structure 360 and the inner spacer 301. In the nanosheet semiconductor device 200, the proximity is less than the inner spacer lateral thickness due to that the proximity push process is implemented. In other words, the nanosheet 222 includes a lateral surface contacting the corresponding one of the source/drain regions 310. The inner spacer 301 includes a lateral surface contacting the corresponding one of the source/drain regions 310 and opposite to the gate structure 360. The lateral surface of the nanosheet 222 is indented relative to the lateral surface of the inner spacer 301.

Figure 27:
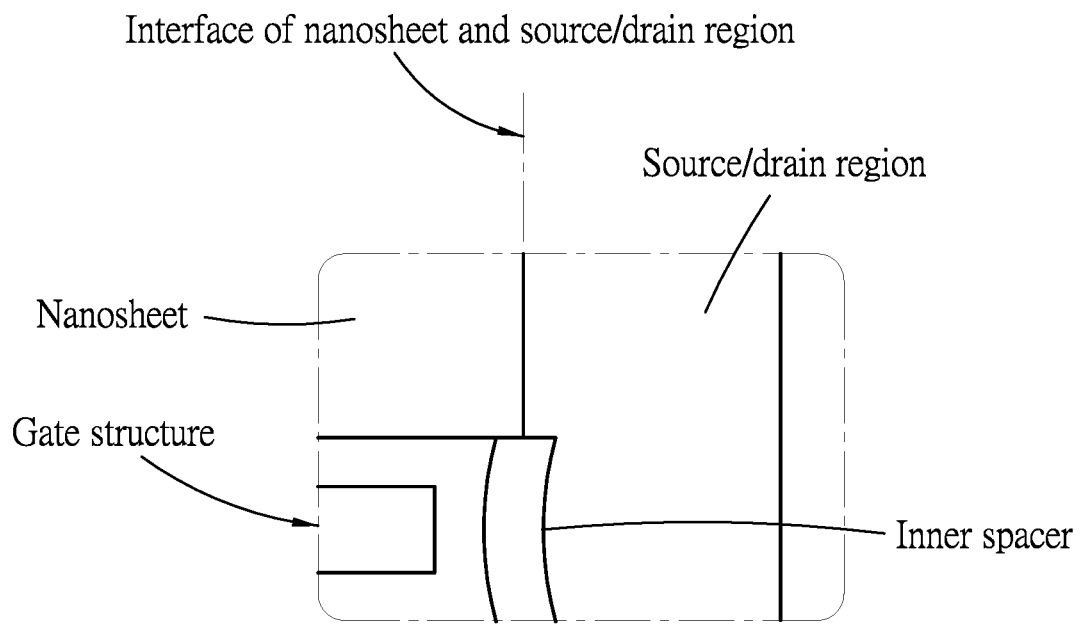
FIG. 27 illustrates a schematic view specifically showing an interface between a nanosheet and a source/drain region in a nanosheet semiconductor device in accordance with some embodiments.
Figure 28:
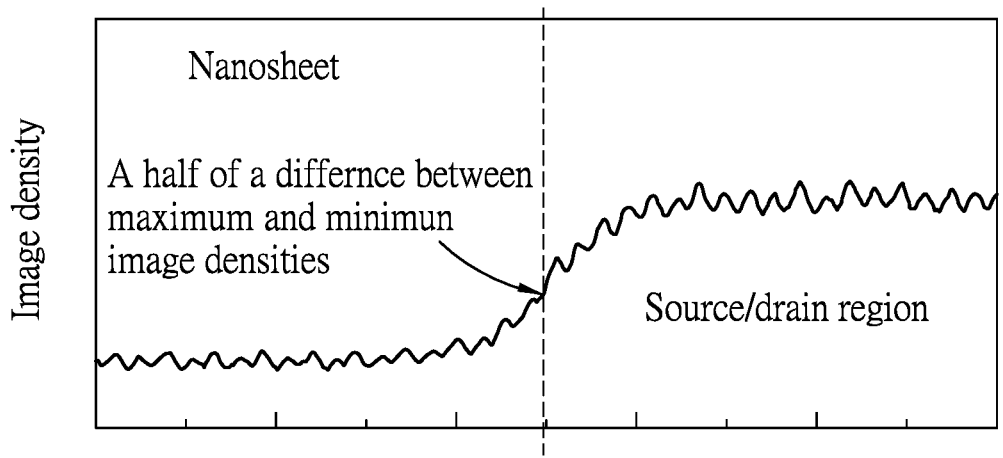
FIG. 28 illustrates a plot showing how to define an interface between a silicon nanosheet and a silicon germanium source/drain region in a nanosheet semiconductor device in accordance with some embodiments. The plot is obtained from a Z-contrast image (an atomic number contrast image) of transmission electron microscopy (TEM).

FIG. 27 illustrates a schematic view specifically showing an interface between a nanosheet and a corresponding one of source/drain regions in a nanosheet semiconductor device in accordance with some embodiment. FIG. 28 is a plot showing how to define the interface. In some embodiments in which the nanosheet is a silicon nanosheet and the source/drain regions are SiGe source/drain regions, the interface between a nanosheet and a corresponding one of the source/drain regions in the nanosheet semiconductor device may be defined to be at a location where an image intensity is a half of a difference between maximum and minimum image intensities in a plot obtained from a Z-contrast image (an atomic number contrast image) of transmission electron microscopy (TEM).

Figure 29:
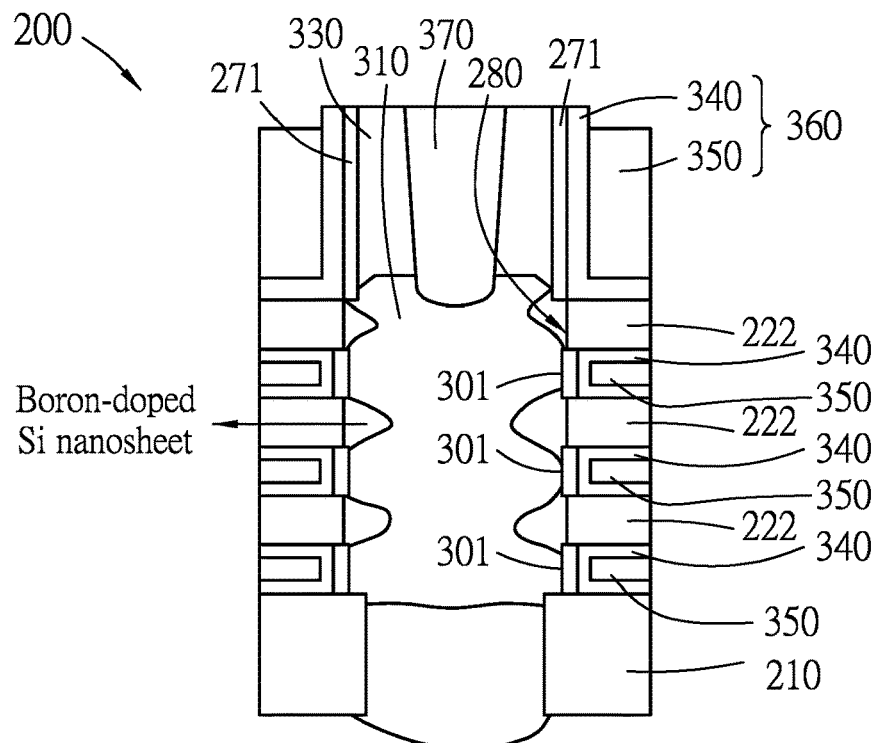
FIG. 29 illustrates a schematic view showing a nanosheet semiconductor device in accordance with some embodiments in which a source/drain region is doped with boron (B).

Referring to FIG. 29, in some embodiments in which the nanosheet 222 are silicon nanosheets and the source/drain regions 310 are SiB source/drain regions (i.e., source/drain regions doped with boron (B)), the interface between the nanosheet 222 and a corresponding one of the source/drain regions 310 in the nanosheet semiconductor device 200 may be defined to be at a location where an image intensity is a half of a difference between maximum and minimum image intensities in a plot obtained from electron energy loss spectroscopy (EELS).

Figure 30:
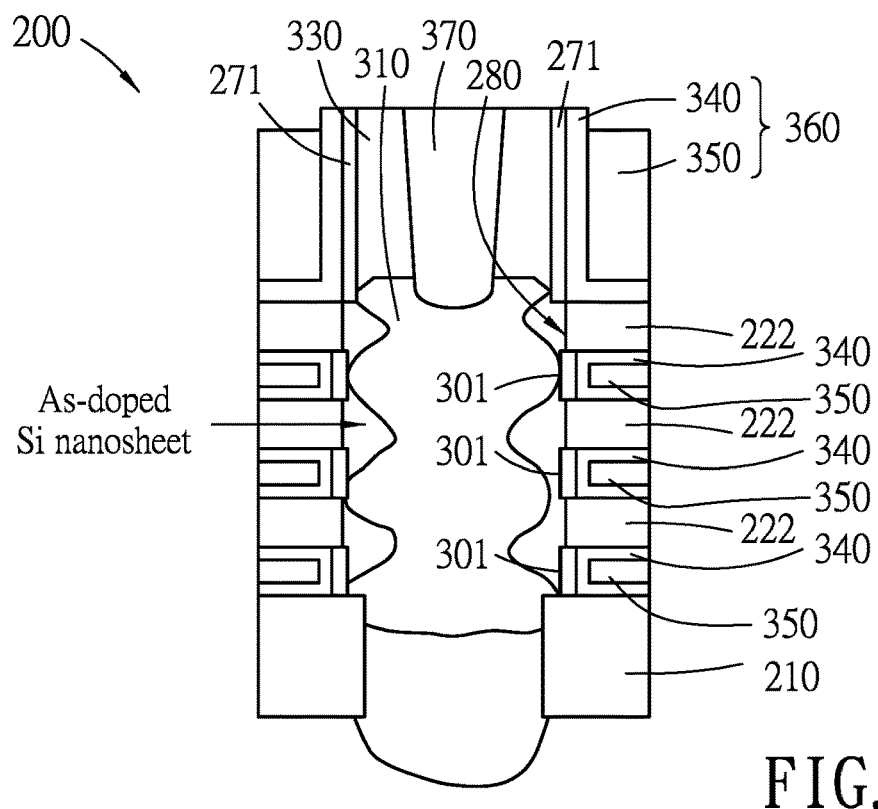
FIG. 30 illustrates a schematic view showing a nanosheet semiconductor device in accordance with some embodiments in which a source/drain region is doped with arsenic (As).

Referring to FIG. 30, in some embodiment in which the nanosheets 222 are silicon nanosheets and the source/drain regions 310 are SiAs source/drain regions (i.e., source/drain regions doped with arsenic (As)), the interface between the nanosheet 222 and a corresponding one of the source/drain regions 310 in the nanosheet semiconductor device 200 may be defined to be at a location where an image intensity is a half of a difference between maximum and minimum image intensities in a plot obtained from energy dispersive X-ray spectroscopy (EDX).

Figure 31:
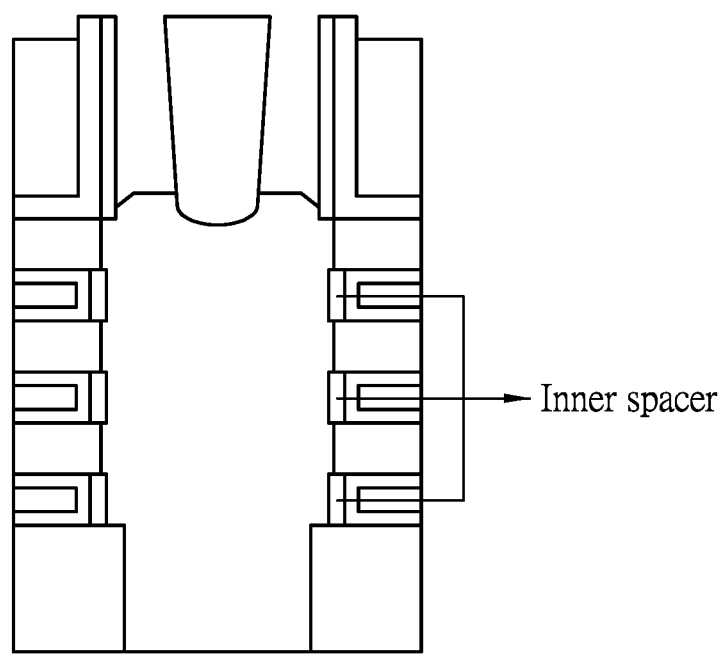
FIG. 31 illustrates a schematic view specifically showing inner spacers in a nanosheet semiconductor device in accordance with some embodiments.

Referring to FIG. 31, which illustrates a schematic view specifically showing inner spacers in a nanosheet semiconductor device in accordance with some embodiment, the inner spacer lateral thickness may be may be determined by a location where an image intensity is a half of a difference between maximum and minimum image intensities in a plot obtained from EDX.

Figure 32:
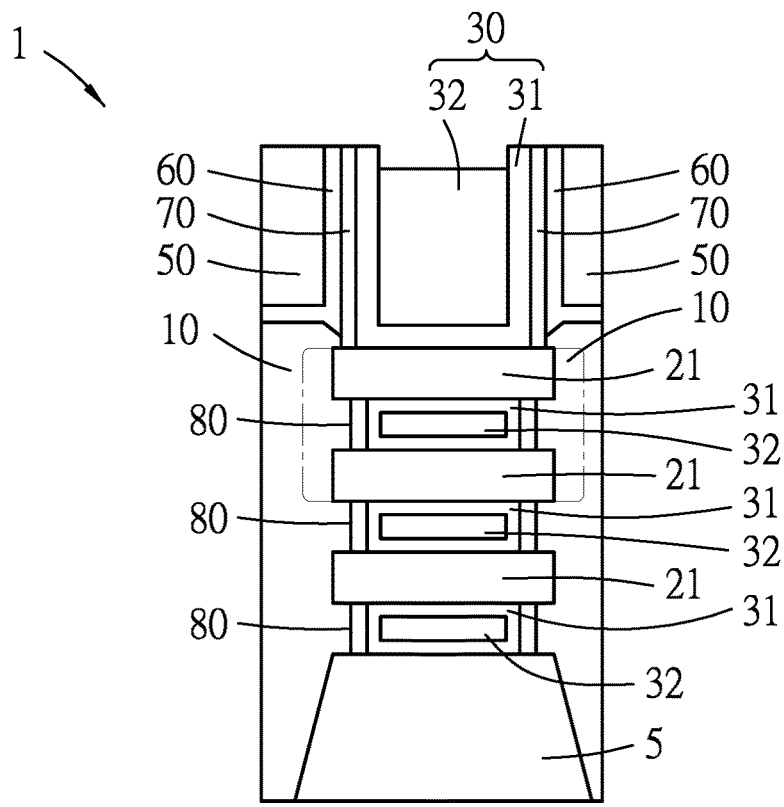
FIGS. 32 and 33 illustrate schematic views specifically showing a proximity and an inner spacer lateral thickness of a nanosheet semiconductor device in accordance with some embodiments without implementation of the proximity push process.
Figure 33:
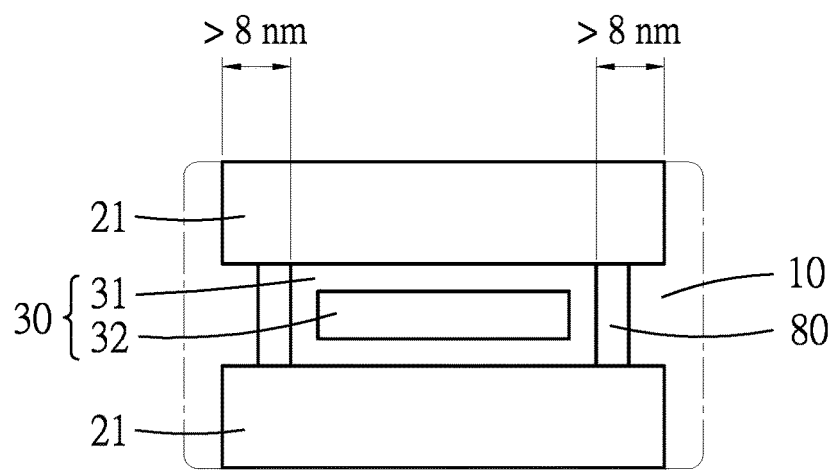
Figure 34:
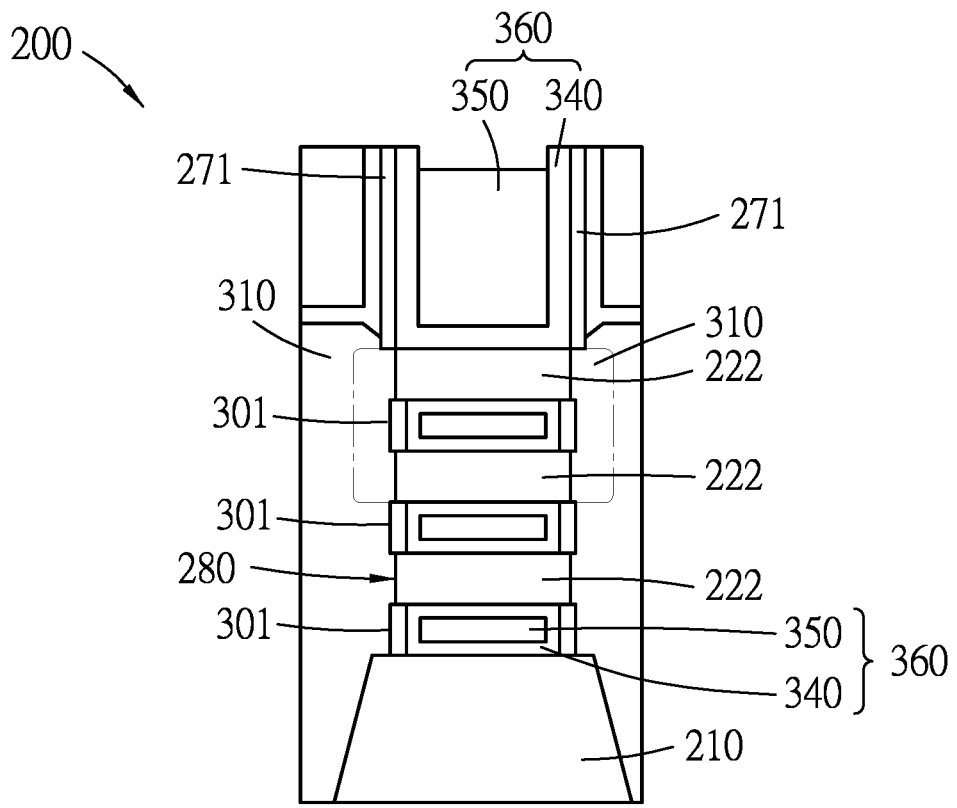
FIGS. 34 and 35 illustrate schematic views specifically showing a proximity and an inner spacer lateral thickness of a nanosheet semiconductor device in accordance with some embodiments with implementation of the proximity push process.
Figure 35:
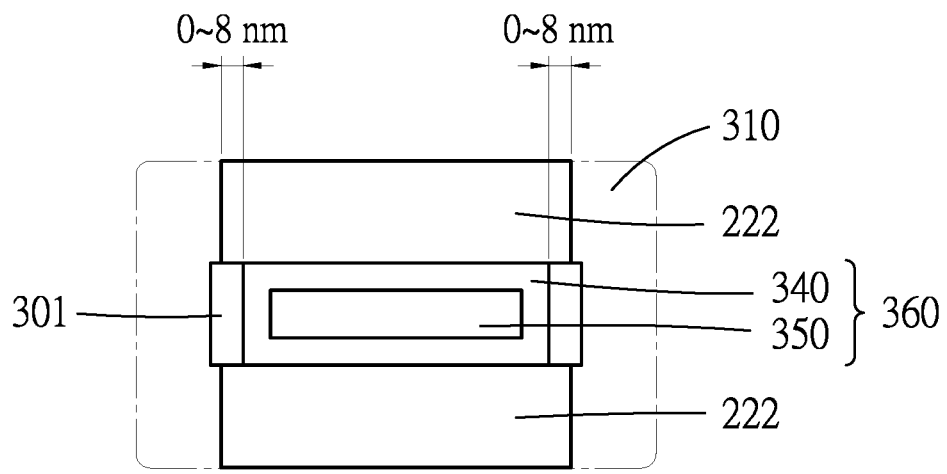
Figure 36:
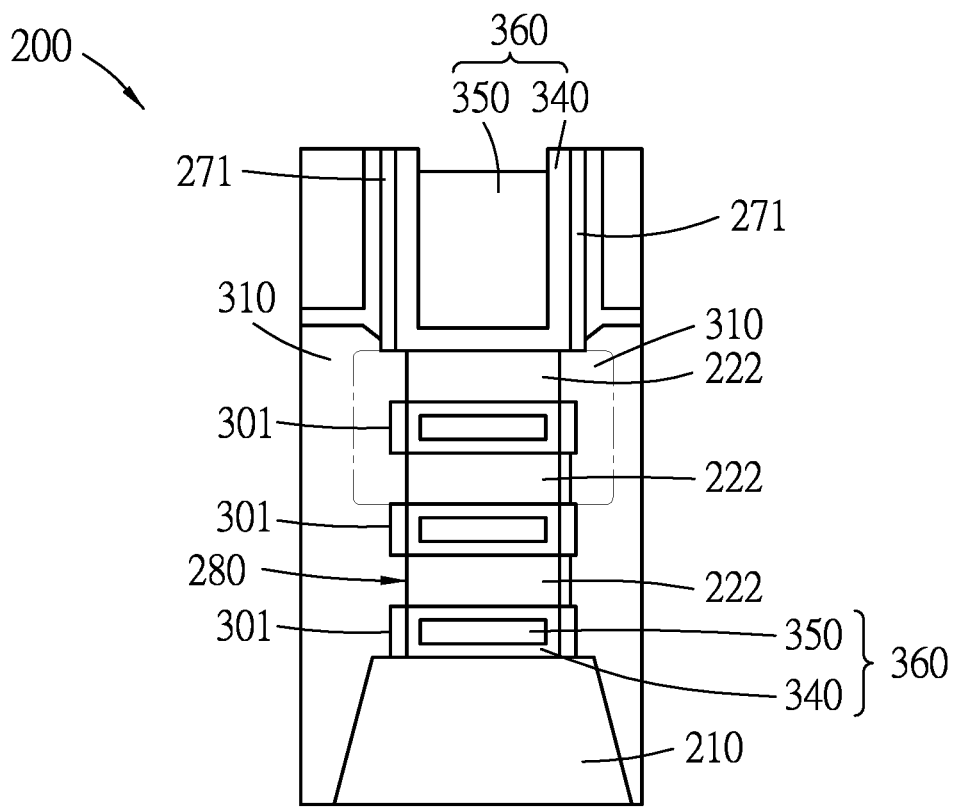
FIGS. 36 and 37 illustrate schematic views specifically showing a proximity and an inner spacer lateral thickness of a nanosheet semiconductor device in accordance with some embodiments with implementation of the proximity push process.
Figure 37:
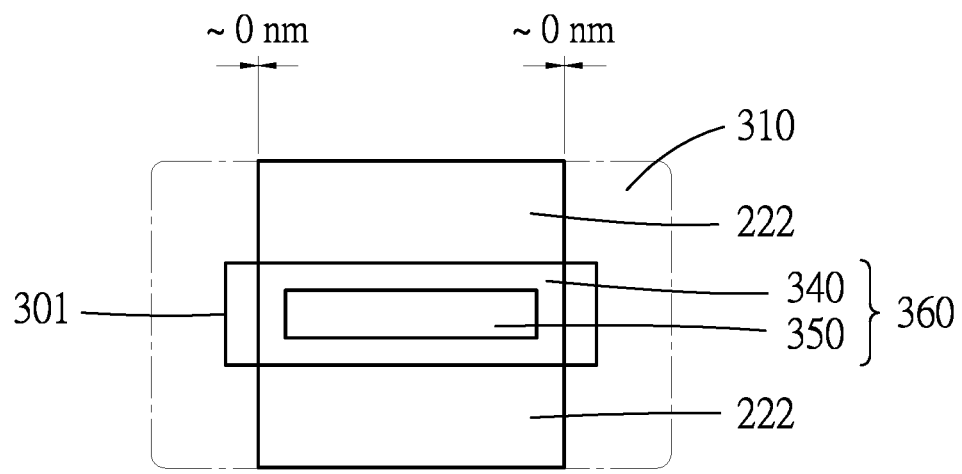

Referring to FIGS. 32 and 33, which illustrate schematic views specifically showing the proximity and the inner spacer lateral thickness of the nanosheet semiconductor device 1 in accordance with some embodiment without implementation of the proximity push process, the proximity is greater than 8 nanometers (nm).

Referring to FIGS. 34 to 37, which illustrate schematic views specifically showing the proximity and the inner spacer lateral thickness of the nanosheet semiconductor device 200 in accordance with some embodiment with implementation of the proximity push process, the proximity can be reduced to a range from 0 nm to 8 nm by the proximity push process.

Figure 38:
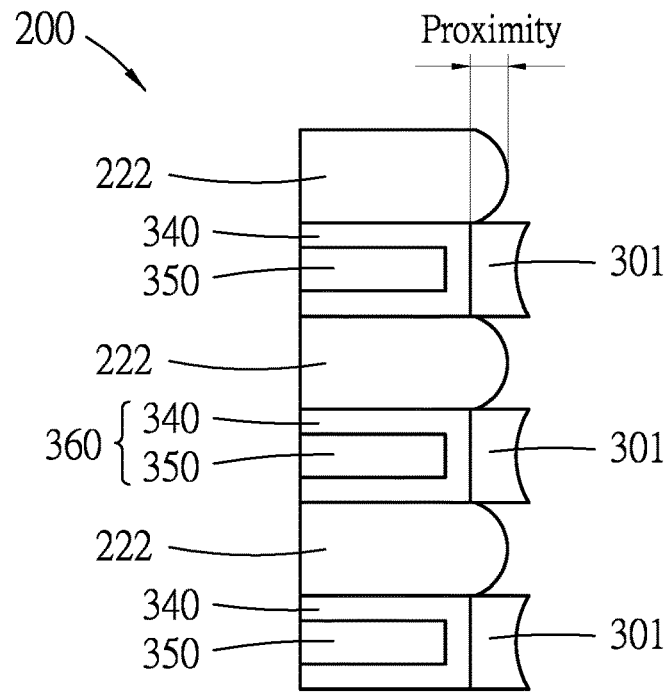
FIGS. 38 to 42 illustrate schematic views showing various possible profiles for lateral surfaces of nanosheets in a nanosheet semiconductor device in accordance with some embodiments
Figure 39:
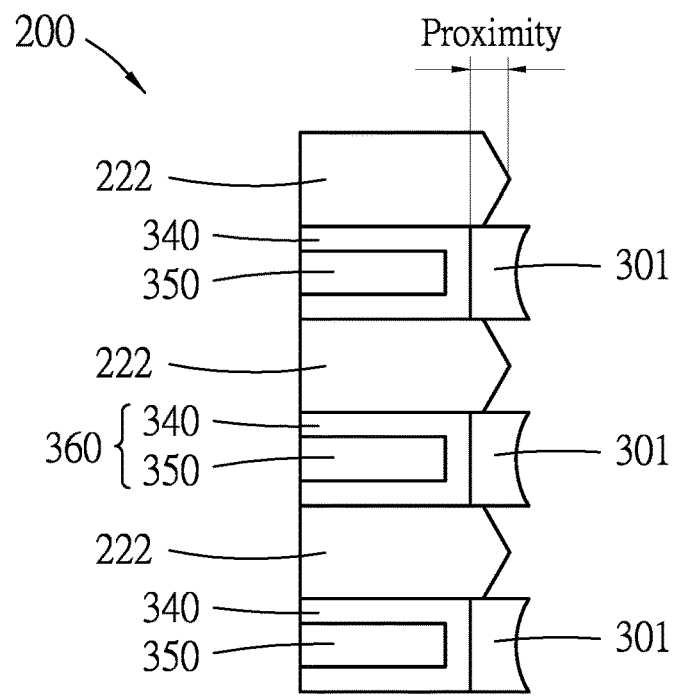
Figure 40:
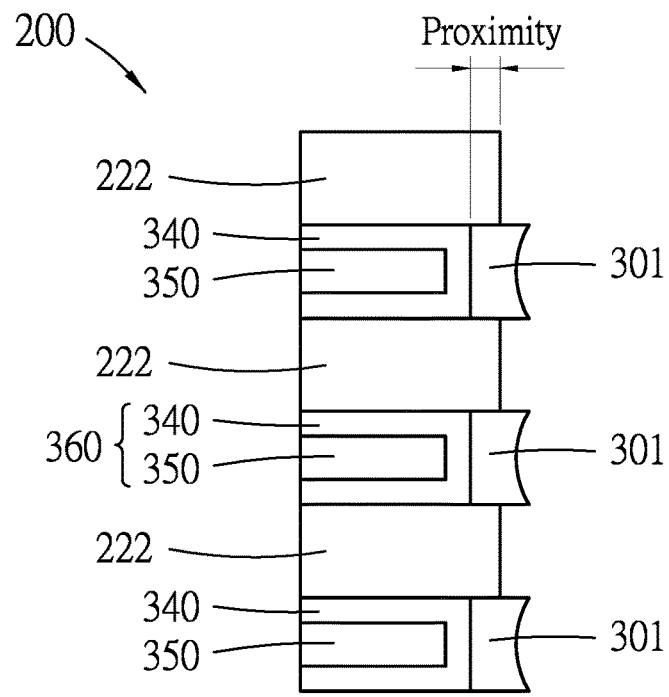
Figure 41:
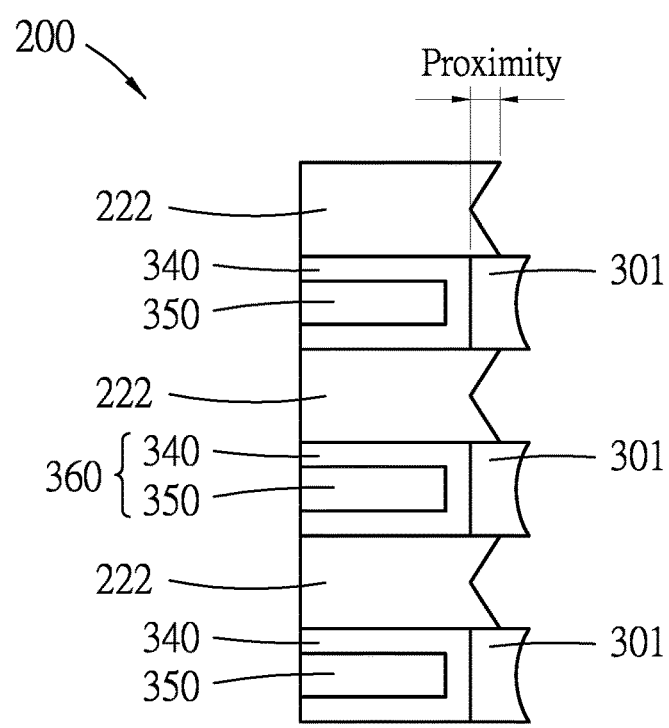
Figure 42:
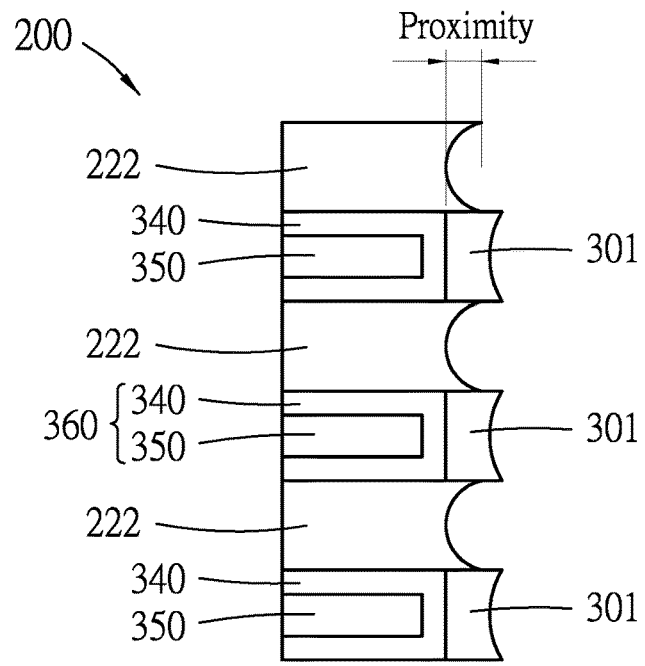

Referring to FIGS. 38 to 42, the lateral surfaces of the second nanosheets 222 of the nanosheet semiconductor device 200 in accordance with some embodiment may be, for example but not limited to, a smooth convex as shown in FIG. 38, a convex with a pointed tip as shown in FIG. 39, a flat surface shown in FIG. 40, a concave with a pointed bottom as shown in FIG. 41, a smooth concave as shown in FIG. 42, or the like.

Figure 43:
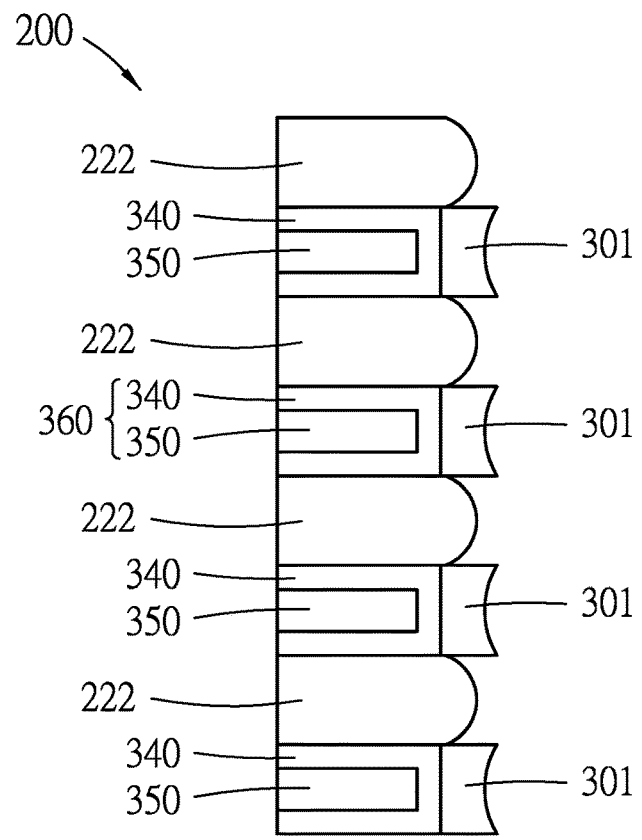
FIGS. 43 and 44 illustrate schematic views showing various numbers of nanosheets in a nanosheet semiconductor device in accordance with some embodiments.
Figure 44:
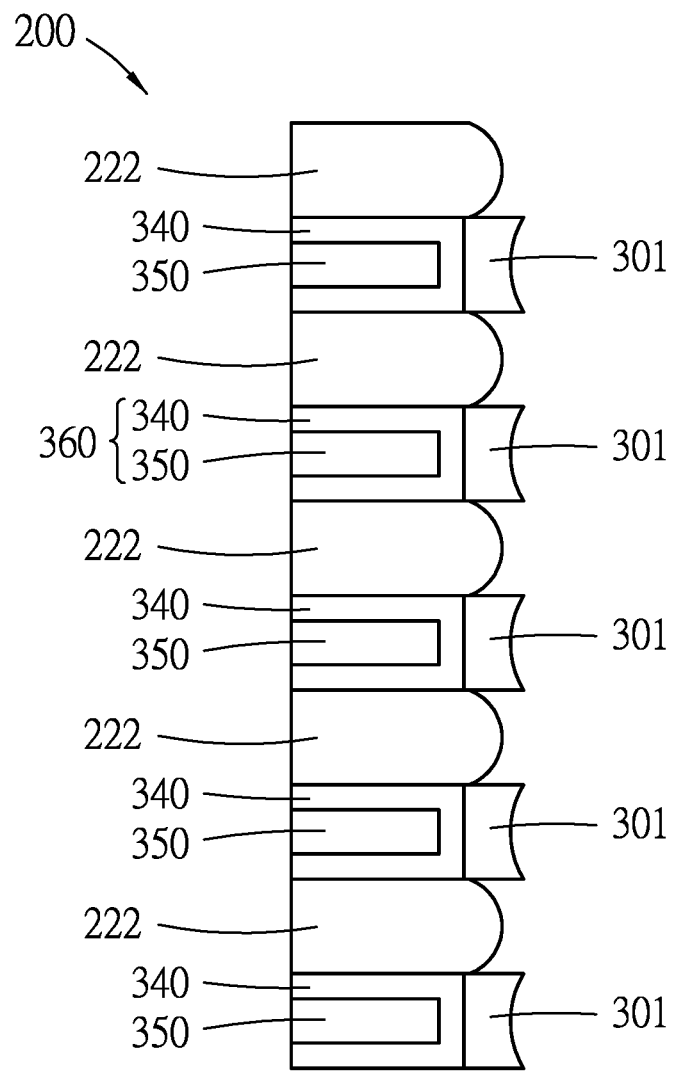

Referring to FIGS. 43 and 44, in addition to the nanosheet semiconductor device 200 shown in FIGS. 38 to 42, in which the number of the second nanosheets 222 surrounded by the lower gate portion of the gate structure 360 in each of the channel regions 280 is three, the number of the second nanosheets 222 surrounded by the lower gate portion of the gate structure 360 in each of the channel regions 280 may be four as shown in FIG. 43, five as shown in FIG. 44, or more.

In the method for manufacturing the nanosheet semiconductor device 200 in accordance with some embodiments, the second nanosheets 222 are laterally recessed to implement the proximity push process to remove the side portions of the second nanosheets 222, so as to form the second lateral recesses 282 spatially communicated with the source/drain recesses 290. Therefore, the epitaxial width (b) in the source/drain regions 310 of the nanosheet semiconductor device 200 can be increased. In other words, the volume for forming the source/drain regions 310 of the nanosheet semiconductor device 200 is increased as compared to the volume for forming the source/drain regions 10 of the nanosheet semiconductor device 1 without implementation of the proximity push process. A channel strain in the channel regions 280 of the nanosheet semiconductor device 200 can be boosted accordingly, so that the carrier mobility for the nanosheet semiconductor device 200 can be enhanced.

In accordance with some embodiments of the present disclosure, a method for manufacturing a nanosheet semiconductor device includes forming a poly gate on a nanosheet stack which includes at least one first nanosheet and at least one second nanosheet alternating with the at least one first nanosheet; recessing the nanosheet stack to form a source/drain recess proximate to the poly gate;

forming an inner spacer laterally covering the at least one first nanosheet; and selectively etching the at least one second nanosheet.

In accordance with some embodiments of the present disclosure, a nanosheet semiconductor device includes a channel region, a first source/drain region, a second source/drain region, a gate structure, and an inner spacer. The channel region includes at least one nanosheet. The first and second source/drain regions are separated from each other by the channel region. The gate structure includes an upper gate portion disposed over the channel region and a lower gate portion surrounding the at least one nanosheet. The inner spacer laterally covers the lower gate portion of the gate structure. The at least one nanosheet includes a lateral surface contacting a corresponding one of the first and second source/drain regions. The inner spacer includes a lateral surface contacting the corresponding one of the first and second source/drain regions. The lateral surface of the at least one nanosheet is indented relative to the lateral surface of the inner spacer.

In accordance with some embodiments of the present disclosure, a nanosheet semiconductor device includes a channel region, a first source/drain region, a second source/drain region, a gate structure, and an inner spacer. The channel region includes at least one nanosheet. The first and second source/drain regions are separated from each other by the channel region. The gate structure includes an upper gate portion disposed over the channel region and a lower gate portion surrounding the at least one nanosheet. The inner spacer laterally covers the lower gate portion of the gate structure. An interface between the at least one nanosheet and a corresponding one of the first and second source/drain regions defines a first reference line. An interface between the inner spacer and the lower gate portion of the gate structure defines a second reference line. A distance between the first and second reference lines is less than a lateral thickness of the inner spacer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nanosheet semiconductor device, comprising:
a channel region including at least one nanosheet;
a first source/drain region and a second source/drain region separated from each other by the channel region in a horizontal direction;
a gate structure including an upper gate portion disposed over the channel region and a lower gate portion surrounding the at least one nanosheet;
a dummy spacer laterally covering the upper gate portion of the gate structure and having a first surface in contact with the upper gate portion of the gate structure and a second surface opposite to the first surface;
a contact etch stop layer disposed to cover a corresponding one of the first source/drain region and the second source/drain region, the contact etch stop layer including a bottom portion that includes a flat main part and an inclined edge part inclined outwardly and downwardly from the flat main part in the horizontal direction; and
an inner spacer laterally covering the lower gate portion of the gate structure,
the at least one nanosheet including a lateral surface contacting a corresponding one of the first and second source/drain regions, the inner spacer including a lateral surface contacting the corresponding one of the first and second source/drain regions, and the lateral surface of the at least one nanosheet being indented relative to the lateral surface of the inner spacer,
the inclined edge part of the bottom portion of the contact etch stop layer extending to terminate at a position of the second surface of the dummy spacer to divide the second surface of the dummy spacer into a lower surface portion and an upper surface portion, the lower surface portion of the second surface of the dummy spacer extending in a vertical direction perpendicular to the horizontal direction.

2. The nanosheet semiconductor device according to claim 1, wherein an interface between the at least one nanosheet and a corresponding one of the first and second source/drain regions defines a first reference line, an interface between the inner spacer and the lower gate portion of the gate structure defines a second reference line, and a distance between the first and second reference lines is in a range from 0 nm to 8 nm.

3. The nanosheet semiconductor device according to claim 1, wherein the first surface of the dummy spacer is aligned with the lateral surface of the at least one nanosheet, and the second surface of the dummy spacer is disaligned with the lateral surface of the inner spacer.

4. The nanosheet semiconductor device according to claim 1, wherein the lateral surface of the at least one nanosheet is indented relative to the first surface of the dummy spacer in a direction from the lateral surface of the at least one nanosheet toward a center of the at least one nanosheet, and the second surface of the dummy spacer is disaligned with the lateral surface of the inner spacer.

5. The nanosheet semiconductor device according to claim 1, wherein the dummy spacer has an upper surface, and the gate structure includes a metal filling layer which has an upper surface lower than the upper surface of the dummy spacer.

6. A nanosheet semiconductor device, comprising:
a channel region including at least one nanosheet;
a first source/drain region and a second source/drain region separated from each other by the channel region in a horizontal direction;
a gate structure including an upper gate portion disposed over the channel region and a lower gate portion surrounding the at least one nanosheet;
a dummy spacer laterally covering the upper gate portion of the gate structure and having a first surface in contact with the upper gate portion of the gate structure and a second surface opposite to the first surface;
a contact etch stop layer disposed to cover a corresponding one of the first source/drain region and the second source/drain region, the contact etch stop layer including a bottom portion that includes a flat main part and an inclined edge part inclined outwardly and downwardly from the flat main part in the horizontal direction; and
an inner spacer laterally covering the lower gate portion of the gate structure, an interface between the at least one nanosheet and a corresponding one of the first and second source/drain regions defining a first reference line, an interface between the inner spacer and the lower gate portion of the gate structure defining a second reference line, a distance between the first and second reference lines being less than a lateral thickness of the inner spacer, the inclined edge part of the bottom portion of the contact etch stop layer extending to terminate at a position of the second surface of the dummy spacer to divide the second surface of the dummy spacer into a lower surface portion and an upper surface portion, the lower surface portion of the second surface of the dummy spacer extending in a vertical direction perpendicular to the horizontal direction.

7. The nanosheet semiconductor device according to claim 6, wherein the distance between the first and second reference lines is in a range from 0 nm to 8 nm.

8. The nanosheet semiconductor device according to claim 6, wherein the at least one nanosheet includes a lateral surface contacting the corresponding one of the first source/drain region and the second source/drain region, the inner spacer includes a lateral surface contacting the corresponding one of the first source/drain region and the second source/drain region, the first surface of the dummy spacer is aligned with the lateral surface of the at least one nanosheet, and the second surface of the dummy spacer is disaligned with the lateral surface of the inner spacer.

9. The nanosheet semiconductor device according to claim 6, wherein the at least one nanosheet includes a lateral surface contacting the corresponding one of the first source/drain region and the second source/drain region, the inner spacer includes a lateral surface contacting the corresponding one of the first source/drain region and the second source/drain region, the lateral surface of the at least one nanosheet is indented relative to the first surface of the dummy spacer in a direction from the lateral surface of the at least one nanosheet toward a center of the at least one nanosheet, and the second surface of the dummy spacer is disaligned with the lateral surface of the inner spacer.

10. The nanosheet semiconductor device according to claim 6, wherein the dummy spacer has an upper surface, and the gate structure includes a metal filling layer which has an upper surface lower than the upper surface of the dummy spacer.

11. A nanosheet semiconductor device, comprising:
a source/drain region;
a first channel region and a second channel region separated from each other by the source/drain region in a horizontal direction, each of the first and second channel regions including at least one nanosheet;
a first gate structure and a second gate structure, each of which includes an upper gate portion disposed over a corresponding one of the first and second channel regions and a lower gate portion surrounding the at least one nanosheet of the corresponding one of the first and second channel regions;
a dummy spacer laterally covering the upper gate portion of a corresponding one of the first gate structure and the second gate structure and having a first surface in contact with the upper gate portion of the corresponding one of the first gate structure and the second gate structure and a second surface opposite to the first surface;
a contact etch stop layer disposed to cover the source/drain region, the contact etch stop layer including a bottom portion that includes a flat main part and an inclined edge part inclined outwardly and downwardly from the flat main part in the horizontal direction;
at least one first inner spacer laterally covering the lower gate portion of the first gate structure; and
at least one second inner spacer laterally covering the lower gate portion of the second gate structure,
a distance between the at least one nanosheet of the first channel region and the at least one nanosheet of the second channel region being greater than a distance between the at least one first inner spacer and the at least one second inner spacer,
the inclined edge part of the bottom portion of the contact etch stop layer extending to terminate at a position of the second surface of the dummy spacer to divide the second surface of the dummy spacer into a lower surface portion and an upper surface portion, the lower surface portion of the second surface of the dummy spacer extending in a vertical direction perpendicular to the horizontal direction.

12. The nanosheet semiconductor device according to claim 11, wherein
the source/drain region includes a main portion, a first protrusion portion laterally protruded from the main portion, and a second protrusion portion laterally protruded from the main portion and disposed oppositely to the first protrusion portion, and
the nanosheet semiconductor device includes two of the first inner spacers separated from each other by the first protrusion portion, and two of the second inner spacers separated from each other by the second protrusion portion.

13. The nanosheet semiconductor device according to claim 12, wherein
the first protrusion portion has a lateral thickness which is up to a lateral thickness of the at least one first inner spacer, and
the second protrusion portion has a lateral thickness which is up to a lateral thickness of the at least one second inner spacer.

14. The nanosheet semiconductor device according to claim 11, wherein the at least one nanosheet of the first channel region includes a lateral surface contacting the source/drain region, the at least one first inner spacer includes a lateral surface contacting the source/drain region, and the lateral surface of the at least one nanosheet of the first channel region is indented relative to the lateral surface of the at least one first inner spacer.

15. The nanosheet semiconductor device according to claim 11, wherein the at least one nanosheet of the second channel region includes a lateral surface contacting the source/drain region, the at least one second inner spacer includes a lateral surface contacting the source/drain region, and the lateral surface of the at least one nanosheet of the second channel region is indented relative to the lateral surface of the at least one second inner spacer.

16. The nanosheet semiconductor device according to claim 11, wherein an interface between the at least one nanosheet of the first channel region and the source/drain region defines a first reference line, an interface between the at least one first inner spacer and the lower gate portion of the first gate structure defines a second reference line, and a distance between the first and second reference lines is less than a lateral thickness of the at least one first inner spacer.

17. The nanosheet semiconductor device according to claim 16, wherein the distance between the first and second reference lines is in a range from 0 nm to 8 nm.

18. The nanosheet semiconductor device according to claim 11, wherein an interface between the at least one nanosheet of the second channel region and the source/drain region defines a first reference line, an interface between the at least one second inner spacer and the lower gate portion of the second gate structure defines a second reference line, and a distance between the first and second reference lines is less than a lateral thickness of the at least one second inner spacer.

19. The nanosheet semiconductor device according to claim 18, wherein the distance between the first and second reference lines is in a range from 0 nm to 8 nm.

20. The nanosheet semiconductor device according to claim 11, wherein the dummy spacer has an upper surface, and each of the first gate structure and the second gate structure includes a metal filling layer which has an upper surface lower than the upper surface of the dummy spacer.

* * * * *